United States Patent
Lee et al.

(10) Patent No.: US 12,477,866 B2
(45) Date of Patent: Nov. 18, 2025

(54) LIGHT-EMITTING ELEMENT AND DISPLAY DEVICE INCLUDING THE SAME

(71) Applicant: SAMSUNG DISPLAY CO., LTD., Yongin-si (KR)

(72) Inventors: Seung Geun Lee, Yongin-si (KR); Seung A Lee, Yongin-si (KR); Dae Hyun Kim, Yongin-si (KR); Dong Uk Kim, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 489 days.

(21) Appl. No.: 17/800,749

(22) PCT Filed: Mar. 27, 2020

(86) PCT No.: PCT/KR2020/004179
§ 371 (c)(1),
(2) Date: Aug. 18, 2022

(87) PCT Pub. No.: WO2021/167156
PCT Pub. Date: Aug. 26, 2021

(65) Prior Publication Data
US 2023/0106399 A1   Apr. 6, 2023

(30) Foreign Application Priority Data
Feb. 19, 2020   (KR) .................. 10-2020-0020359

(51) Int. Cl.
*H10H 20/821*   (2025.01)
*H01L 25/075*   (2006.01)
(Continued)

(52) U.S. Cl.
CPC ....... *H10H 20/821* (2025.01); *H01L 25/0753* (2013.01); *H10H 20/8316* (2025.01); *H10H 20/857* (2025.01)

(58) Field of Classification Search
CPC ............. H10H 20/821; H10H 20/8316; H10H 20/857; H10H 20/819; H10H 20/812;
(Continued)

(56) References Cited

U.S. PATENT DOCUMENTS 9,570,425 B2   2/2017   Do
10,340,419 B2   7/2019   Kim et al.
(Continued)

FOREIGN PATENT DOCUMENTS

CN   102144342   8/2011
JP   WO 02/23640 A1 *   9/2001
(Continued)

OTHER PUBLICATIONS

International Search Report, with English translation, corresponding to International Application No. PCT/KR2020/004179 dated Nov. 11, 2020.
(Continued)

*Primary Examiner* — Mohammad A Rahman
(74) *Attorney, Agent, or Firm* — Womble Bond Dickinson (US) LLP

(57) ABSTRACT

A light emitting element includes: a first semiconductor layer; an active layer disposed on the first semiconductor layer; a second semiconductor layer disposed on the active layer; a third semiconductor layer comprising a third-first semiconductor layer and a third-second semiconductor layer stacked on the second semiconductor layer; and a fourth semiconductor layer disposed on the third-second semiconductor layer. The third semiconductor layer is a tunneling junction layer. A sum of a thickness of the fourth semicon-
(Continued)

ductor layer and the third-second semiconductor layer is different from a sum of a thickness of the second semiconductor layer and the third-first semiconductor layer.

20 Claims, 29 Drawing Sheets

(51) Int. Cl.
  *H10H 20/831* (2025.01)
  *H10H 20/857* (2025.01)
(58) Field of Classification Search
  CPC .... H10H 20/811; H10H 20/81; H10H 20/852; H10H 29/142; H10H 20/83; H01L 25/0753; H01L 25/167
  See application file for complete search history.

(56) References Cited

U.S. PATENT DOCUMENTS

| | | |
|---|---|---|
| 10,490,696 B2 | 11/2019 | David et al. |
| 10,672,946 B2 | 6/2020 | Cho et al. |
| 11,367,823 B2 | 6/2022 | Kim et al. |
| 2011/0220871 A1 | 9/2011 | Kamikawa et al. |
| 2013/0234107 A1 | 9/2013 | Cheon et al. |
| 2017/0294451 A1 | 10/2017 | Kim et al. |
| 2018/0012929 A1 | 1/2018 | Lu et al. |
| 2018/0019377 A1* | 1/2018 | Kim ..................... H10H 29/142 |
| 2019/0305183 A1 | 10/2019 | Lutgen |

FOREIGN PATENT DOCUMENTS

| | | |
|---|---|---|
| JP | 2013-55170 | 3/2013 |
| KR | 10-2010-0082215 | 7/2010 |
| KR | 10-1436123 | 11/2014 |
| KR | 10-2018-0007376 | 1/2018 |
| KR | 10-2018-0009014 | 1/2018 |
| KR | 10-2019-0124359 A | 11/2019 |
| KR | 10-2136770 | 7/2020 |
| KR | 10-2020-0102615 | 9/2020 |
| KR | 10-2281223 | 7/2021 |
| WO | WO 02/23640 A1 * | 9/2001 |
| WO | 02/23640 | 3/2002 |
| WO | 2017/011387 | 1/2017 |
| WO | 2017/201363 | 11/2017 |
| WO | 2018/081635 | 5/2018 |

OTHER PUBLICATIONS

Written Opinion, with English translation, corresponding to International Application No. PCT/KR2020/004179, dated Nov. 11, 2020.

* cited by examiner

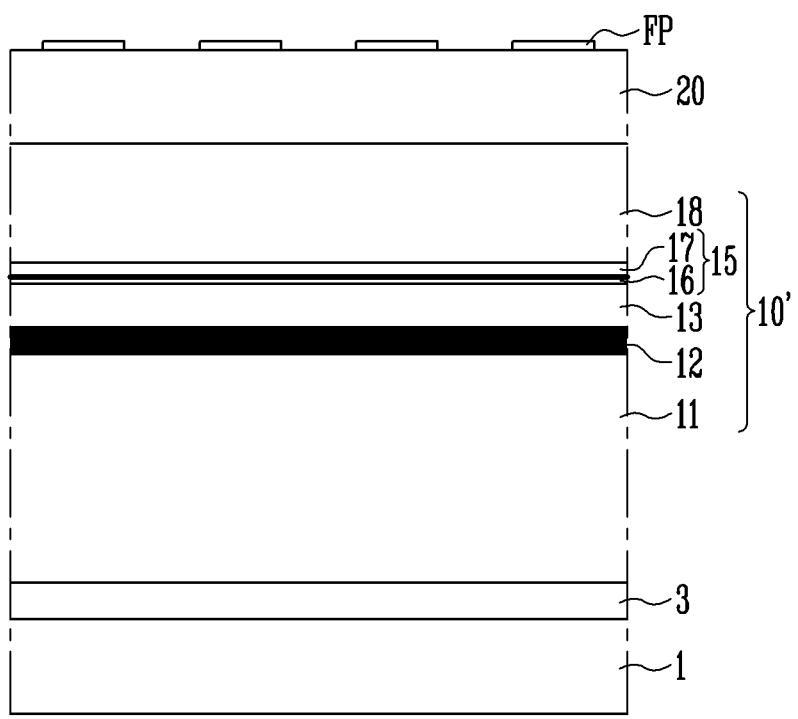

LIGHT-EMITTING ELEMENT AND DISPLAY DEVICE INCLUDING THE SAME

CROSS-REFERENCE TO RELATED APPLICATION(S)

This application is a national entry of International Application No. PCT/KR2020/004179, filed on Mar. 27, 2020, which claims under 35 U.S.C. §§ 119(a) and 365(b) priority to and benefits of Korean Patent Application No. 10-2020-0020359, filed on Feb. 19, 2020, in the Korean Intellectual Property Office (KIPO), the entire contents of which are incorporated herein by reference.

BACKGROUND

1. Technical Field

Various embodiments relate to a light emitting element and a display device having the light emitting element.

2. Description of the Related Art

A light emitting diode may have relatively long durability even under poor environmental conditions, and have excellent performances in terms of lifespan and luminance. Recently, research on the technology of applying such light emitting diodes to various display devices has become appreciably more active.

As a part of such research, technologies of fabricating a light emitting diode having a subminiature size corresponding to the micro scale or the nano scale using an inorganic crystalline structure, for example, a structure formed by growing a nitride-based semiconductor are being developed. The light emitting diodes may be formed to have a size small enough to form a pixel of a display device, etc. The light emitting diodes may be separately independently grown on a substrate, and the grown light emitting diodes may be separated therefrom and used to manufacture a display panel.

SUMMARY

Various embodiments are directed to a light emitting element in which an active layer is disposed, using a tunneling junction layer, at a position adjacent to an intermediate portion of the light emitting element with respect to a longitudinal direction, so that light output efficiency may be enhanced.

Various embodiments are directed to a display device including the light emitting element.

However, embodiments of the disclosure are not limited to those set forth herein. The above and other embodiments will become more apparent to one of ordinary skill in the art to which the disclosure pertains by referencing the detailed description of the disclosure given below.

In an embodiment, a light emitting element may include: a first semiconductor layer; an active layer disposed on the first semiconductor layer; a second semiconductor layer disposed on the active layer; a third semiconductor layer including a third-first semiconductor layer and a third-second semiconductor layer stacked on the second semiconductor layer; and a fourth semiconductor layer disposed on the third-second semiconductor layer. The third semiconductor layer may be a tunneling junction layer. A sum of a thickness of the fourth semiconductor layer and the third-second semiconductor layer may be different from a sum of a thickness of the second semiconductor layer and the third-first semiconductor layer.

In an embodiment, the first semiconductor layer, the fourth semiconductor layer, and the third-second semiconductor layer may include an n-type semiconductor layer doped with an n-type dopant. The second semiconductor layer and the third-first semiconductor layer may include a p-type semiconductor layer doped with a p-type dopant.

In an embodiment, the sum of the thickness of the fourth semiconductor layer and the third-second semiconductor layer may be greater than the sum of the thickness of the second semiconductor layer and the third-first semiconductor layer.

In an embodiment, the third-first semiconductor layer may be doped with a p-type dopant having a concentration higher than that of the second semiconductor layer. The third-second semiconductor layer may be doped with an n-type dopant having a concentration higher than those of the first and the fourth semiconductor layers.

In an embodiment, the light emitting element may further include an insulating layer surrounding an outer circumferential surface of each of the first semiconductor layer, the active layer, the second semiconductor layer, the third semiconductor layer, and the fourth semiconductor layer.

In an embodiment, a distance from a contact surface between the third-first semiconductor layer and the third-second semiconductor layer to an outer surface of the fourth semiconductor layer may be different from a distance from the contact surface between the third-first semiconductor layer and the third-second semiconductor layer to an outer surface of the first semiconductor layer.

In an embodiment, the distance from the contact surface between the third-first semiconductor layer and the third-second semiconductor layer to the outer surface of the fourth semiconductor layer may be less than the distance from the contact surface between the third-first semiconductor layer and the third-second semiconductor layer to the outer surface of the first semiconductor layer.

In an embodiment, the contact surface between the third-first semiconductor layer and the third-second semiconductor layer may be disposed closer to the outer surface of the fourth semiconductor layer than the outer surface of the first semiconductor layer, based on a point corresponding to a half of an entire length of the light emitting element.

In an embodiment, a display device may include: a substrate including a display area including a plurality of pixel areas, and a non-display area enclosing at least one side of the display area; and a pixel provided in each of the pixel areas. The pixel may include first and second electrodes spaced apart from each other on the substrate, and a plurality of light emitting elements electrically connected to each of the first and the second electrodes.

In an embodiment, each of the light emitting elements may include a first semiconductor layer, an active layer, a second semiconductor layer, a third semiconductor layer, and a fourth semiconductor layer that are sequentially stacked in a direction. The third semiconductor layer may be a tunneling junction layer. The third semiconductor layer may include a third-first semiconductor layer directly disposed on the second semiconductor layer, and a third-second semiconductor layer provided between the third-first semiconductor layer and the fourth semiconductor layer.

In an embodiment, a sum of a thickness of the fourth semiconductor layer and the third-second semiconductor layer may be different from a sum of a thickness of the second semiconductor layer and the third-first semiconductor layer.

In an embodiment, the first semiconductor layer, the fourth semiconductor layer, and the third-second semiconductor layer may include an n-type semiconductor layer doped with an n-type dopant. The second semiconductor layer and the third-first semiconductor layer may include a p-type semiconductor layer doped with a p-type dopant.

In an embodiment, the sum of the thickness of the third-second semiconductor layer and the fourth semiconductor layer that are sequentially stacked in the direction may be greater than the sum of the thickness of the second semiconductor layer and the third-first semiconductor layer that are sequentially stacked in the direction.

In an embodiment, the third-first semiconductor layer may be doped with a p-type dopant having a concentration higher than that of the second semiconductor layer. The third-second semiconductor layer may be doped with an n-type dopant having a concentration higher than those of the first and the fourth semiconductor layers.

In an embodiment, the pixel may further include an insulating pattern disposed on one surface of each of the light emitting elements. The insulating pattern may overlap each of the light emitting elements between the first electrode and the second electrode.

In an embodiment, a distance from a contact surface between the third-first semiconductor layer and the third-second semiconductor layer to an outer surface of the fourth semiconductor layer with respect to the direction may be less than a distance from the contact surface between the third-first semiconductor layer and the third-second semiconductor layer to an outer surface of the first semiconductor layer. For example, the contact surface between the third-first semiconductor layer and the third-second semiconductor layer may be disposed closer to the outer surface of the fourth semiconductor layer than to the outer surface of the first semiconductor layer, based on a point corresponding to a half of an entire length of each of the light emitting elements with respect to the direction.

In an embodiment, the contact surface between the third-first semiconductor layer and the third-second semiconductor layer may be disposed between a point corresponding to a half of an entire width of one surface of the insulating pattern that contacts each of the light emitting elements with respect to a longitudinal direction of each of the light emitting elements and a point corresponding to an end of the one surface.

In an embodiment, the active layer of each of the light emitting elements may include a first surface that contacts the first semiconductor layer with respect to the direction, and a second surface that is opposite to the first surface and contacts the second semiconductor layer. The first surface of the active layer may be disposed between a point corresponding to a half of an entire width of one surface of the insulating pattern that contacts each of the light emitting elements with respect to a longitudinal direction of each of the light emitting elements and a point corresponding to another end of the one surface.

In an embodiment, the pixel may include: a bank pattern provided between the substrate and the first electrode and between the substrate and the second electrode; a first contact electrode connecting each of the light emitting elements with the first electrode; and a second contact electrode connecting each of the light emitting elements with the second electrode.

In an embodiment, each of the light emitting elements may include an insulating layer surrounding each of an outer circumferential surface of the first semiconductor layer, an outer circumferential surface of the active layer, an outer circumferential surface of the second semiconductor layer, an outer circumferential surface of the third semiconductor layer, and an outer circumferential surface of the fourth semiconductor layer that are sequentially stacked in the direction. Here, the first semiconductor layer may include a portion of a side surface and an outer surface that are not covered with the insulating layer with respect to the direction. The fourth semiconductor layer may include a portion of a side surface and an outer surface that are not covered with the insulating layer with respect to the direction.

In an embodiment, the first contact electrode may directly contact the portion of the side surface and the outer surface of the first semiconductor layer. The second contact electrode may directly contact the portion of the side surface and the outer surface of the fourth semiconductor layer.

In an embodiment, a display device may include a substrate on which a plurality of pixels are provided. Each of the pixels may include: a plurality of light emitting elements disposed on the substrate; and a first electrode electrically connected to an end of each of the light emitting elements, and a second electrode electrically connected to a remaining end of each of the light emitting elements, the first electrode and the second electrode being spaced apart from each other.

In an embodiment, each of the light emitting elements may include a first semiconductor layer, an active layer, a second semiconductor layer, a third semiconductor layer, and a fourth semiconductor layer that are stacked in a direction. The third semiconductor layer may be a tunneling junction layer and include a third-first semiconductor layer directly disposed on the second semiconductor layer, and a third-second semiconductor layer provided between the third-first semiconductor layer and the fourth semiconductor layer.

In an embodiment, semiconductor layers of a same type are disposed on opposite ends of each of the light emitting elements.

In an embodiment, a distance from a contact surface between the third-first semiconductor layer and the third-second semiconductor layer to an outer surface of the fourth semiconductor layer with respect to the direction may be less than a distance from the contact surface between the third-first semiconductor layer and the third-second semiconductor layer to an outer surface of the first semiconductor layer.

In an embodiment, the first semiconductor layer may be disposed on an end of the opposite ends of each of the light emitting elements, and the fourth semiconductor layer may be disposed on a remaining end of the opposite ends of each of the light emitting elements. The first and fourth semiconductor layers may include an n-type semiconductor layer doped with an n-type dopant.

An embodiment may provide a light emitting element in which, in a light emitting stacked pattern including a tunneling junction layer (or a third semiconductor layer), a sum of the thickness of a fourth semiconductor layer (e.g., an n-type semiconductor layer) and a third-second junction semiconductor layer (e.g., a high concentration n-type semiconductor layer) is designed to be greater than a sum of the thickness of a second semiconductor layer (e.g., a p-type semiconductor layer) and a third-first junction semiconductor layer (e.g., a high concentration p-type semiconductor layer), so that efficiency of light emitted from an active layer may be enhanced.

Furthermore, an embodiment may provide a light emitting element in which the active layer is disposed adjacent to an intermediate (e.g., central) portion of the light emitting element with respect to a longitudinal direction of the light emitting element, so that the efficiency of light emitted from the active layer may be further enhanced.

In addition, an embodiment may provide a display device including the light emitting device.

The effects of the embodiments are not limited by the foregoing, and other various effects are anticipated herein.

BRIEF DESCRIPTION OF THE DRAWINGS

FIGS. 3A, 3B, 3C, 3D, 3E, 3F, 3G, 3H, 3I, 3J, and 3K are schematic cross-sectional views sequentially illustrating a method of fabricating the light emitting element of FIGS. 1 and 2.

DETAILED DESCRIPTION OF THE EMBODIMENTS

Figure 1:
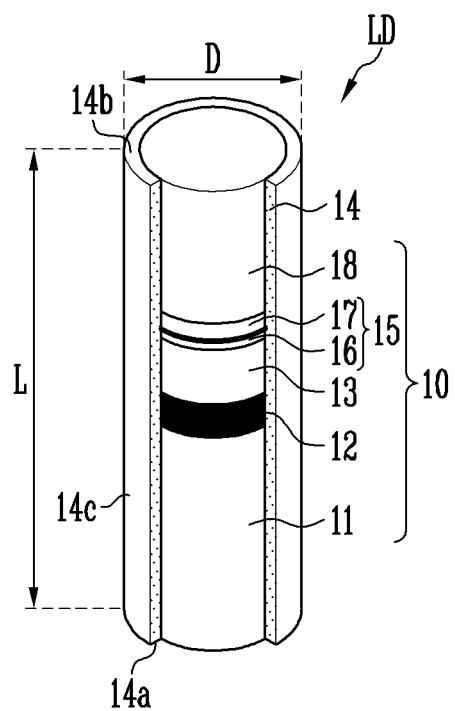
FIG. 1 is a schematic perspective view illustrating a light emitting element in accordance with an embodiment

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing example features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the X, Y, and Z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the inventive concepts. Further, the blocks, units, and/or modules of some example embodiments may be physically combined into more complex blocks, units, and/or modules without departing from the scope of the inventive concepts.

Figure 2:
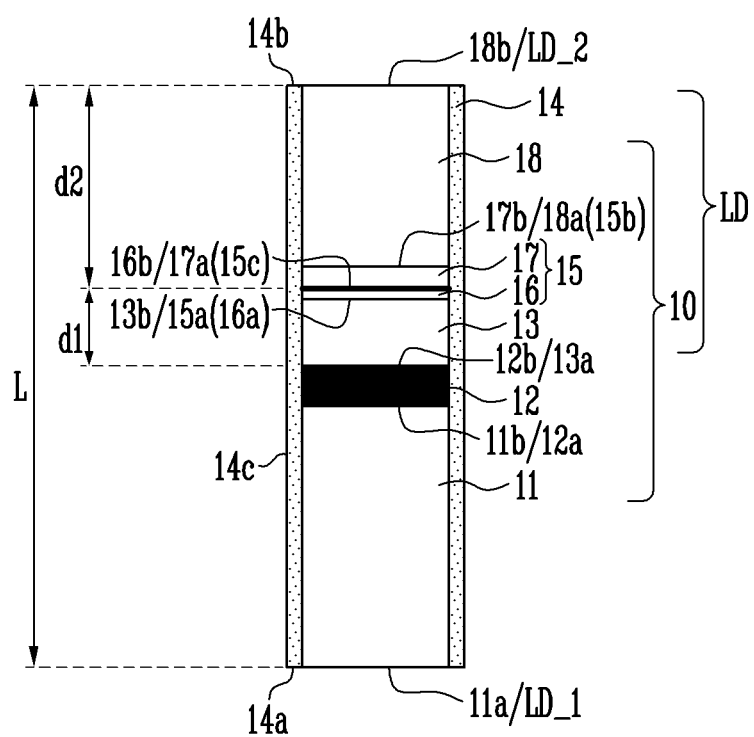
FIG. 2 is a schematic cross-sectional view illustrating the light emitting element of FIG. 1.
Figure 3A:
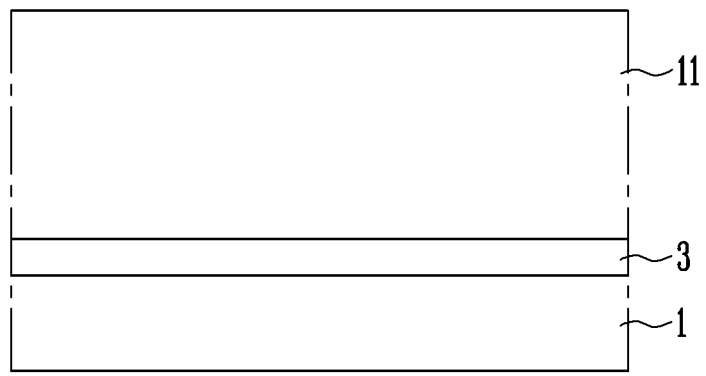
Figure 3B:
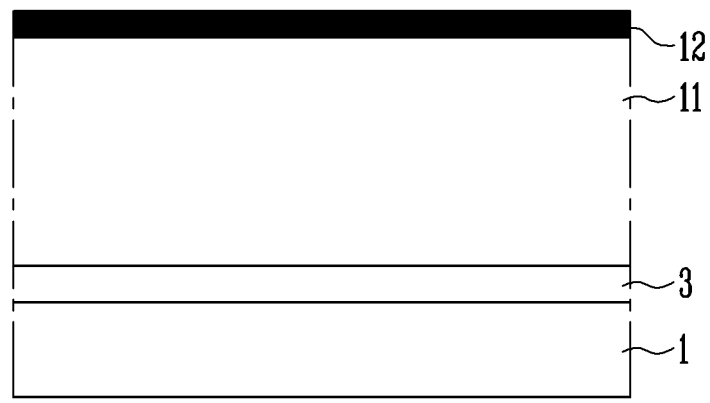
Figure 3C:
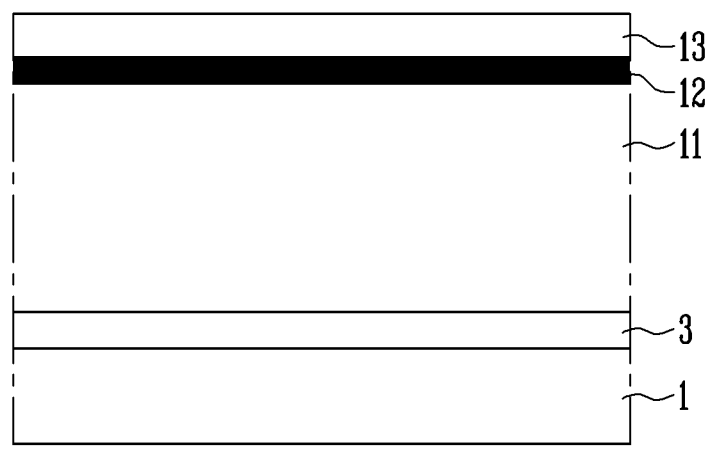
Figure 3D:
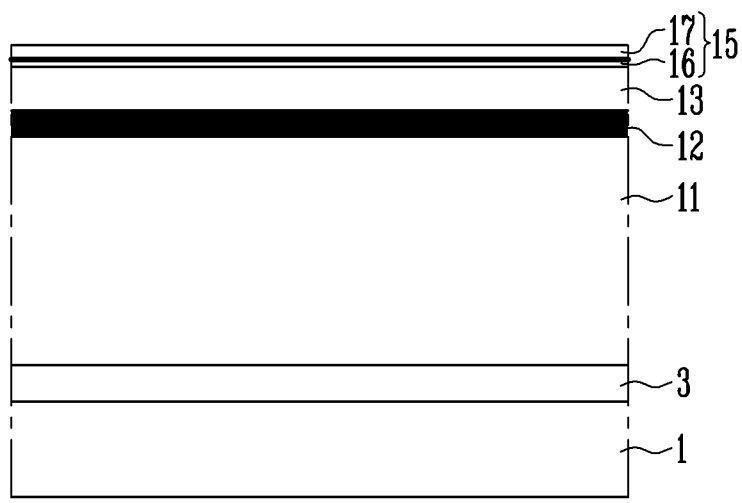
Figure 3E:
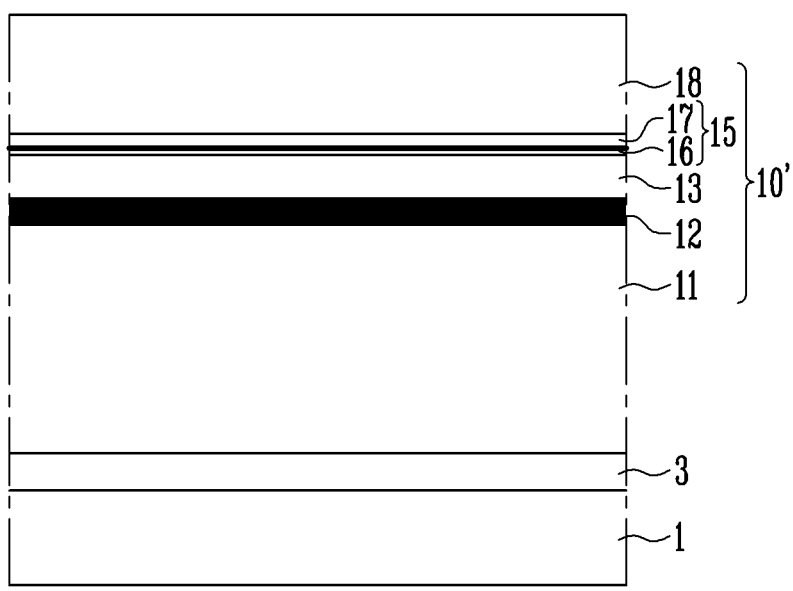
Figure 3G:
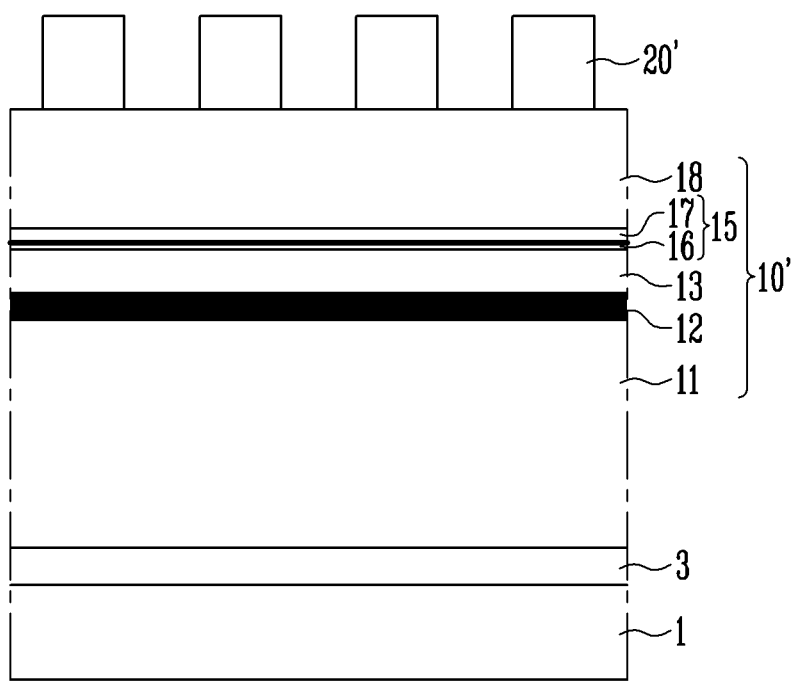
Figure 3H:
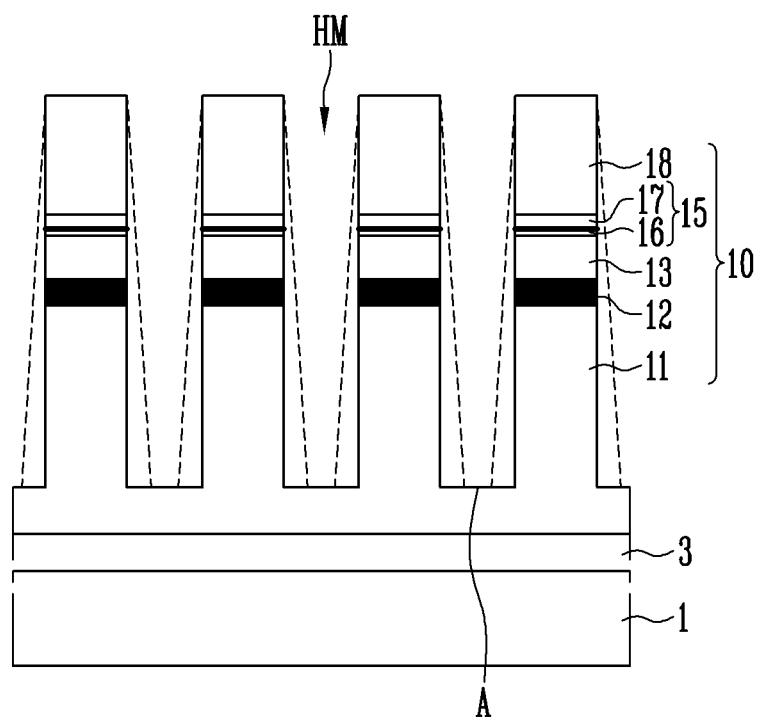
Figure 3I:
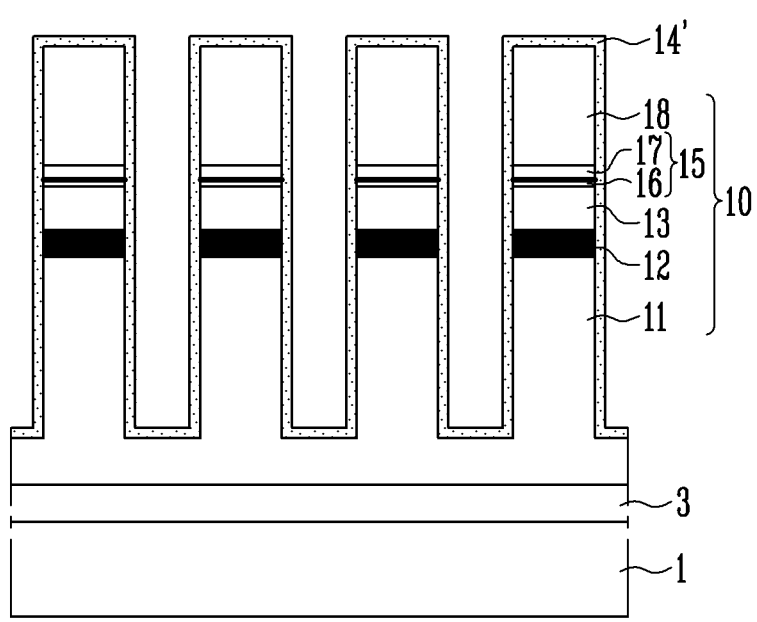
Figure 3J:
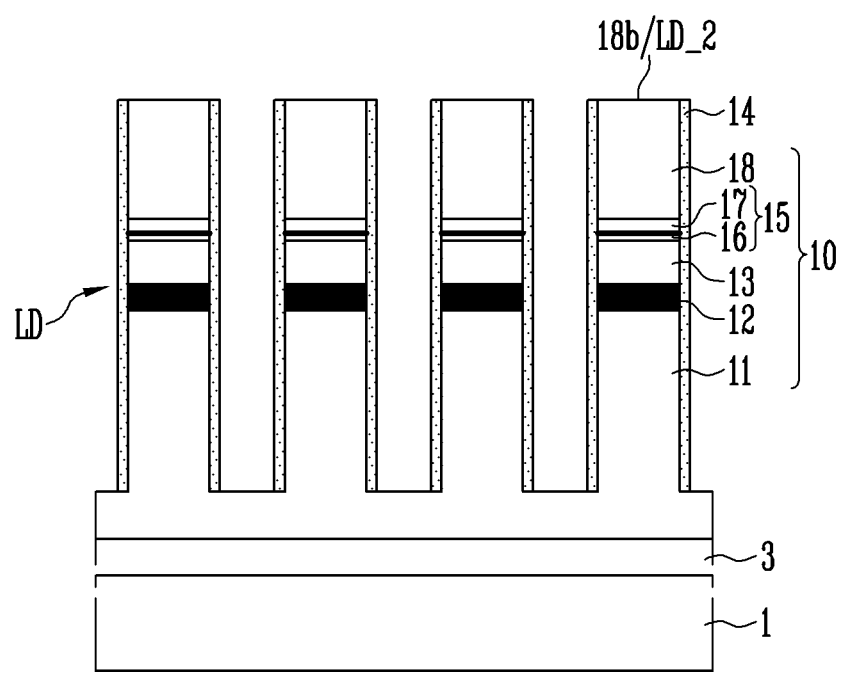
Figure 3K:
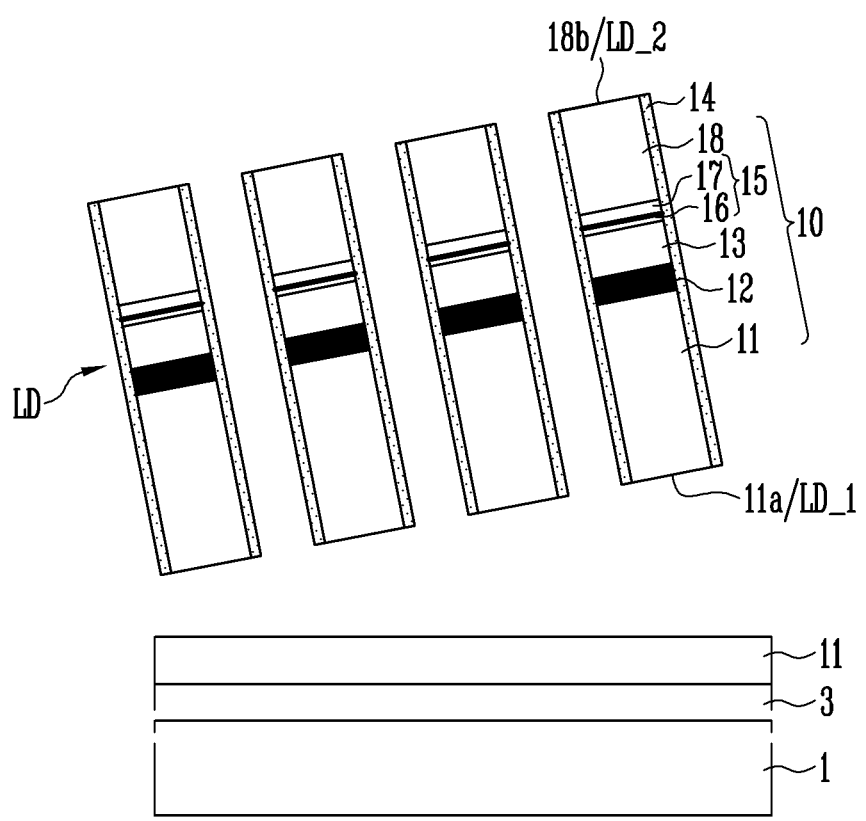

FIG. 1 is a schematic perspective view illustrating a light emitting element in accordance with an embodiment, and FIG. 2 is a schematic cross-sectional view of the light emitting element of FIG. 1.

Although FIGS. 1 and 2 illustrate a cylindrical light emitting element LD, the type and/or shape of the light emitting element LD is not limited thereto.

Referring to FIGS. 1 and 2, the light emitting element LD may include a first semiconductor layer 11, a second semiconductor layer 13, and an active layer 12 interposed between the first semiconductor layer 11 and the second semiconductor layer 13. For example, the light emitting element LD may include a third semiconductor layer 15 disposed on the second semiconductor layer 13, and a fourth semiconductor layer 18 disposed on the third semiconductor layer 15.

For example, the light emitting element LD may include a light emitting stacked pattern 10 obtained by sequentially stacking the first semiconductor layer 11, the active layer 12, the second semiconductor layer 13, the third semiconductor layer 15, and the fourth semiconductor layer 18 in a stacking direction.

The light emitting element LD may be formed in a shape extending in one direction (e.g., the stacking direction). When an extension direction of the light emitting element LD is defined as a longitudinal direction, the light emitting element LD may have one end (e.g., a lower end) and a remaining end (e.g., an upper end) with respect to the extension direction. Any one of the first and fourth semiconductor layers 11 and 18 may be disposed on the one end (e.g., the lower end) of the light emitting element LD, and the other one of the first and fourth semiconductor layers 11 and 18 may be disposed on the remaining end (e.g., the upper end) of the light emitting element LD. For example, the first semiconductor layer 11 may be disposed on the one end (e.g., the lower end) of the light emitting element LD, and the fourth semiconductor layer 18 may be disposed on the remaining end (e.g., the upper end) of the light emitting element LD.

The light emitting element LD may have various shapes. For example, the light emitting element LD may have a rod-like shape or a bar-like shape extending in the longitudinal direction e.g., to have an aspect ratio greater than 1. In an embodiment of the present disclosure, the length L of the light emitting element LD with respect to the longitudinal direction may be greater than the diameter D (e.g., a width of a cross-section) thereof. The light emitting element LD may include a light emitting diode (LED) formed to have a subminiature size, for example, with a diameter D and/or a length L corresponding to the nano scale or the micro scale.

The diameter D of the light emitting element LD may approximately range from about 0.5 µm to about 5 µm, and the length L thereof may approximately range from about 1 µm to about 10 µm. However, the diameter D and the length L of the light emitting element LD are not limited thereto. The size of the light emitting element LD may be changed to meet requirements (e.g., design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer which includes any one semiconductor material of InAlGaN, GaN, AlGaN, InGaN, AlN, and InN and is doped with a first conductive dopant (e.g., an n-type dopant) such as Si, Ge, or Sn. However, the constituent material of the first semiconductor layer 11 is not limited to thereto, and various other materials may be used to form the first semiconductor layer 11. For example, the first semiconductor layer 11 may include gallium nitride (GaN) semiconductor material doped with a first conductive dopant (e.g., an n-type dopant). For example, the first semiconductor layer 11 may include an n-type GaN semiconductor layer. The first semiconductor layer 11 may include, with regard to the longitudinal direction L of the light emitting element LD, an upper surface 11b that contacts the active layer 12, and a lower surface 11a exposed to the outside. The lower surface 11a of the first semiconductor layer 11 may correspond to the one end (e.g., the lower end) of the light emitting element LD.

The active layer 12 may be disposed on the first semiconductor layer 11 and have a single or multiple quantum well structure. For example, in case that the active layer 12 has a multiple quantum well structure, the active layer 12 may be formed by periodically repeatedly stacking a barrier layer, a stain reinforcing layer, and a well layer which are implemented as one unit. The stain reinforcing layer may have a lattice constant less than that of the barrier layer so that strain, for example, compressive strain, to be applied to the well layer can be further reinforced. However, embodiments are not limited to the structure of the active layer 12.

The active layer 12 may emit light having a wavelength in a range of about 400 nm to about 900 nm, and have a double hetero structure. In an embodiment, a clad layer doped with a conductive dopant may be formed over or under the active layer 12 with respect to the longitudinal direction L of the light emitting element LD. For example, the clad layer may be formed of an AlGaN layer or an InAlGaN layer. In an embodiment, a material such as AlGaN or AlInGaN may be used to form the active layer 12, and in addition to this, various other materials may be used to form the active layer 12. The active layer 12 may include a first surface 12a that contacts the first semiconductor layer 11, and a second surface 12b that contacts the second semiconductor layer 13. The first surface 12a and the second surface 12b of the active layer 12 may be opposite to each other in the longitudinal direction L of the light emitting element LD.

When an electric field having a certain voltage or more is applied between the opposite ends of the light emitting element LD, the light emitting element LD may emit light by coupling of electron-hole pairs in the active layer 12. Since light emission of the light emitting element LD can be controlled based on the foregoing principle, the light emitting element LD may be used as a light source (e.g., a light emitting source) of various light emitting devices including a pixel of a display device.

The second semiconductor layer 13 may be disposed on the second surface 12b of the active layer 12 and include a semiconductor layer of a type different from that of the first semiconductor layer 11. For example, the second semiconductor layer 13 may include at least one p-type semiconductor layer. For instance, the second semiconductor layer 13 may include a p-type semiconductor layer which includes any one semiconductor material of InAlGaN, GaN, AlGaN, InGaN, AlN, and InN, and is doped with a second conductive dopant (e.g., a p-type dopant) such as Mg. However, the material of the second semiconductor layer 13 is not limited thereto, and various other materials may be used to form the second semiconductor layer 13. In an embodiment, the second semiconductor layer 13 may include gallium nitride (GaN) semiconductor material doped with a second conductive dopant (e.g., a p-type dopant). For example, the second semiconductor layer 13 may be formed of a p-type GaN semiconductor. The second semiconductor layer 13 may include, with respect to the longitudinal direction L of the light emitting element LD, a lower surface 13a that contacts the second surface 12b of the active layer 12, and an upper surface 13b that contacts a lower surface 15a of the third semiconductor layer 15.

In an embodiment, the first semiconductor layer 11 and the second semiconductor layer 13 may have different thicknesses with respect to the longitudinal direction L of the light emitting element LD. For example, the first semiconductor layer 11 may have a thickness greater than that of the second semiconductor layer 13 with respect to the longitudinal direction L of the light emitting element LD. Hence, as illustrated in FIGS. 1 and 2, the active layer 12 of the light emitting element LD may be disposed at a position closer to the upper surface 13b of the second semiconductor layer 13 than to the lower surface 11a of the first semiconductor layer 11.

Although FIGS. 1 and 2 illustrate that the first semiconductor layer 11 and the second semiconductor layer 13 are each implemented as a single layer, embodiments are not limited thereto. In an embodiment, according to the material of the active layer 12, the first semiconductor layer 11 and the second semiconductor layer 13 each may further include at least one or more layers, for example, a clad layer and/or a tensile strain barrier reducing (TSBR) layer. The TSBR layer may be a strain relief layer of which a lattice structure is disposed between other semiconductor layers so that the strain relief layer can function as a buffer layer to reduce a difference in lattice constant. Although the TSBR layer may be implemented as a p-type semiconductor layer such as p-GaInP, p-AlInP, or p-AlGaInP, embodiments are not limited thereto.

The third semiconductor layer 15 may be provided and/or formed on the second semiconductor layer 13. The third semiconductor layer 15 may include a third-first semiconductor layer 16 and a third-second semiconductor layer 17. The third semiconductor layer 15 may have a thickness in a range of about 2 nm to about 100 nm, in the longitudinal direction (L) of the light emitting element LD, but embodiments are not limited thereto. Each of the third-first and third-second semiconductor layers 16 and 17 may have a thickness in a range of about 25 nm to about 35 nm, but embodiments are not limited thereto. The third-first semiconductor layer 16 and the third-second semiconductor layer 17 may have a same thickness, but embodiments are not limited thereto. In an embodiment, the third-first semiconductor layer 16 and the third-second semiconductor layer 17 may have different thicknesses.

The third-first semiconductor layer 16 may be directly disposed on the upper surface 13b of the second semiconductor layer 13 in the longitudinal direction L of the light emitting element LD, and include a semiconductor layer of a same type as that of the second semiconductor layer 13. For example, the third-first semiconductor layer 16 may include at least one p-type semiconductor layer. For instance, the third-first semiconductor layer 16 may include a p-type semiconductor layer doped with a second conductive dopant (e.g., a p-type dopant) such as Mg or Zn and, for example, include at least one semiconductor material (or substance) of GaN, InGaN, AlInGaN, and AlGaInP. In case that the light emitting element LD is configured to emit blue-based and/or green-based light, the third-first semiconductor layer 16 may include semiconductor material (or substance) of AlInGaN. In case that the light emitting element LD is configured to emit red-based light, the third-first semiconductor layer 16 may include semiconductor material (or substance) of AlGaInP.

The third-first semiconductor layer 16 may include semiconductor material (or substance) doped with a second conductive dopant (e.g., a p-type dopant) having a concentration higher than that of the second semiconductor layer 13. In an embodiment, a portion of the third-first semiconductor layer 16 disposed on the second semiconductor layer 13 may have a graded dopant concentration in a range of a dopant concentration of the second semiconductor layer 13 to a desirable dopant concentration in the third-first semiconductor layer 16, but embodiments are not limited thereto. The third-first semiconductor layer 16 may include, with respect to the longitudinal direction L of the light emitting element LD, a lower surface 16a that contacts the second semiconductor layer 13, and an upper surface 16b that contacts the third-second semiconductor layer 17. For example, the lower surface 16a of the third-first semiconductor layer 16 may be the lower surface 15a of the third semiconductor layer 15.

The third-second semiconductor layer 17 may be directly disposed on the upper surface 16b of the third-first semiconductor layer 16 with respect to the longitudinal direction L of the light emitting element LD, include a semiconductor layer of a type different from that of the third-first semiconductor layer 16, and include a semiconductor layer of a same type as that of the first semiconductor layer 11. For example, the third-second semiconductor layer 17 may include at least one n-type semiconductor layer. For instance, the third-second semiconductor layer 17 may include an n-type semiconductor layer doped with a first conductive dopant (e.g., a n-type dopant) such as Si, Ge and, for example, include at least one semiconductor material (or substance) of InGaN, GaN, AlGaInP, and AlInGaN. In case that the light emitting element LD is configured to emit blue-based and/or green-based light, the third-second semiconductor layer 17 may include semiconductor material (or substance) of AlInGaN. In case that the light emitting element LD is configured to emit red-based light, the third-second semiconductor layer 17 may include semiconductor material (or substance) of AlGaInP.

The third-second semiconductor layer 17 may include semiconductor material (or substance) doped with a first conductive dopant (e.g., an n-type dopant) having a concentration higher than that of the first semiconductor layer 11. In an embodiment, the third-second semiconductor layer 17 may have a graded dopant concentration in a range of the maximum value close to that of the third-first semiconductor layer 16 to the minimum value close to that of the fourth semiconductor layer 18, but embodiments are not limited thereto. The third-second semiconductor layer 17 may include, with respect to the longitudinal direction L of the light emitting element LD, a lower surface 17a that contacts the third-first semiconductor layer 16, and an upper surface 17b that contacts the fourth semiconductor layer 18. For example, the upper surface 17b of the third-second semiconductor layer 17 may be the upper surface 15b of the third semiconductor layer 15.

In an embodiment, the third semiconductor layer 15 formed by stacking different types of semiconductor layers may be a tunneling junction layer. The third semiconductor layer 15 (e.g., the tunneling junction layer) including the third-first semiconductor layer 16 and the third-second semiconductor layer 17 may be formed to be sufficiently thin and sufficiently doped, so that when current is conducted in a reverse bias mode, a series of low voltage drops may occur. The voltage drop applied to the third semiconductor layer 15 (e.g., the tunneling junction layer) may approximately range from 0.1 V to 1 V, but embodiments are not limited thereto.

In an embodiment, an intermediate layer including InGaN, AlN, or the like may be disposed between the third-first semiconductor layer 16 and the third-second semiconductor layer 17. The intermediate layer may use a polarization field in III-nitride to assist the realignment of bands for tunneling. The foregoing polarization effect may reduce doping requirements in the 3-1 and third-second semiconductor layers 16 and 17 and reduce a tunneling distance to be required. The composition of the intermediate layer may differ from the composition of each of the third-first and third-second semiconductor layers 16 and 17, and be selected for the realignment of the bands due to polarization charges that are present between other materials in a III-nitride material system.

The fourth semiconductor layer 18 may be disposed on the third semiconductor layer 15 (e.g., the tunneling junction layer) in the longitudinal direction L of the light emitting element LD, and contact (e.g., directly contact) the third-second semiconductor layer 17. The fourth semiconductor layer 18 may include a semiconductor layer of a same type as that of the third-second semiconductor layer 17. For example, the fourth semiconductor layer 18 may include at least one n-type semiconductor layer. For instance, the fourth semiconductor layer 18 may include an n-type semiconductor layer doped with a first conductive dopant (e.g., a n-type dopant) such as Si, Ge and, for example, include at least one semiconductor material (or substance) of InGaN, GaN, AlGaInP, and AlInGaN. The fourth semiconductor layer 18 may be used as an ohmic contact layer, but embodiments are not limited thereto.

The fourth semiconductor layer 18 may include semiconductor material (or substance) doped with a first conductive dopant (e.g., an n-type dopant) having a concentration lower than that of the third-second semiconductor layer 17. The fourth semiconductor layer 18 may include, with respect to the longitudinal direction L of the light emitting element LD, a lower surface 18a that contacts the upper surface 17b of the third-second semiconductor layer 17, and an upper surface 18b exposed to the outside.

In an embodiment, the light emitting stacked pattern 10 may be provided and/or formed in a shape corresponding to the shape of the light emitting element LD. For example, in case that the light emitting element LD is provided and/or formed in a cylindrical shape, the light emitting stacked pattern 10 may also be provided and/or formed in a cylindrical shape. In case that the light emitting stacked pattern 10 has a cylindrical shape, the first semiconductor layer 11, the active layer 12, the second semiconductor layer 13, the third semiconductor layer 15 (e.g., the tunneling junction layer), and the fourth semiconductor layer 18 each may have a cylindrical shape.

The first semiconductor layer 11 may be disposed on the one end (e.g., the lower end) of the light emitting element LD with respect to the longitudinal direction L of the light emitting element LD, and the fourth semiconductor layer 18 may be disposed on the remaining end (e.g., the upper end) of the light emitting element LD. The light emitting element LD may include the lower surface 11a of the first semiconductor layer 11 and the upper surface 18b of the fourth semiconductor layer 18 that are disposed on the opposite ends of the light emitting element LD and exposed to the outside. The lower surface 11a of the first semiconductor layer 11 and the upper surface 18b of the fourth semiconductor layer 18 each may be a surface (for example, an outer surface) exposed to the outside so that the surface can be brought into contact with and electrically connected to an external conductive material. In an embodiment, the lower surface 11a (e.g., the outer surface) of the first semiconductor layer 11 may be a lower surface LD_1 of the light emitting element LD. The upper surface 18b (e.g., the outer surface) of the fourth semiconductor layer 18 may be an upper surface LD_2 of the light emitting element LD.

In case that the light emitting element LD has a cylindrical shape, the lower surface 11a (e.g., the outer surface) of the first semiconductor layer 11 and the upper surface 18b (e.g., the outer surface) of the fourth semiconductor layer 18 each may have a circular shape. In an embodiment, in case that the light emitting element LD has an elliptic cylindrical shape, the lower surface 11a (e.g., the outer surface) of the first semiconductor layer 11 and the upper surface 18b (e.g., the outer surface) of the fourth semiconductor layer 18 each may have an elliptical shape. In an embodiment, in case that the light emitting element LD has a polyprism shape, the lower surface 11a (the outer surface) of the first semiconductor layer 11 and the upper surface 18b (or the outer surface) of the fourth semiconductor layer 18 each may have a polygonal shape.

In case that the light emitting stacked pattern 10 is provided and/or formed in a shape corresponding to the shape of the light emitting element LD, the light emitting stacked pattern 10 may have a length substantially similar or equal to the length L of the light emitting element LD. In the following embodiment, description will be assumed that the length of the light emitting stacked pattern 10 is a same as the length L of the light emitting element LD.

In an embodiment, the light emitting element LD may further include an insulating film 14 that encloses or surrounds an outer circumferential surface of the light emitting stacked pattern 10. In an embodiment, the insulating film 14 may be omitted, or may be provided to cover only a portion of the light emitting stacked pattern 10.

The insulating film 14 may include transparent insulating material. For example, the insulating film 14 may include at least one insulating material selected from the group consisting of silicon oxide ($SiO_x$), silicon nitride ($SiN_x$), silicon oxynitride (SiON), aluminium oxide ($AlO_x$), titanium dioxide ($TiO_2$), etc., but embodiments are not limited thereto. Various materials having insulating properties may be used.

The insulating film 14 may prevent a short-circuit, which is formed in the active layer 12 due to making contact with a conductive material except for the first semiconductor layer 11 and the second semiconductor layer 13. Furthermore, occurrence of a defect on the surface of the light emitting element LD may be minimized due to the insulating film 14, whereby the lifespan and efficiency of the light emitting element LD may be improved. In case that a plurality of light emitting elements LD are disposed in close contact with each other, the insulating film 14 may prevent an undesired short-circuit from occurring between the light emitting elements LD. For example, the insulating film 14 may be omitted, so long as a short circuit between the active layer 12 and external conductive material may not occur.

The insulating film 14 may be formed and/or disposed on the outer circumferential surface (e.g., the surface) of the light emitting stacked pattern 10 to enclose or surround an outer circumferential surface of at least the active layer 12, and may further enclose or surround an outer circumferential surface of each of the first, second, third, and fourth semiconductor layers 11, 13, 15, and 18. For convenience of description, FIG. 1 illustrates the insulating film 14 of which a portion has been removed. The first semiconductor layer 11, the active layer 12, the second semiconductor layer 13, the third semiconductor layer 15 (e.g., the tunneling junction layer), and the fourth semiconductor layer 18 that are substantially included in the light emitting element LD may be enclosed or surround by the insulating film 14.

In an embodiment, the insulating film 14 may completely enclose outer circumferential surfaces of the opposite ends of the light emitting element LD that include a same type of semiconductor layers, but embodiments are not limited thereto. In another embodiment, the insulating film 14 may enclose only a portion of the outer circumferential surface of the first semiconductor layer 11 and/or only a portion of the outer circumferential surface of the fourth semiconductor layer 18. For example, the insulating film 14 may partially or entirely surround the outer circumferential surface of each of the first, second, third, and fourth semiconductor layers 11, 13, 15, and 18.

The insulating film 14 may include a lower surface 14a that is parallel to the lower surface 11a (e.g., the outer surface) of the first semiconductor layer 11 in a direction intersecting the longitudinal direction L of the light emitting element LD, an upper surface 14b that is opposite to the lower surface 14a with respect to the longitudinal direction L, and a side surface 14c that encloses the outer circumferential surface of the light emitting stacked pattern 10. The lower surface 14a of the insulating film 14, the upper surface 14b of the insulating film 14, and the side surface 14c of the insulating film 14 may be connected to each other. For example, the side surface 14c of the insulating film 14 may continuously extend between the lower surface 14a and the upper surface 14b of the insulating film 14. In another embodiment, the side surface 14c of the insulating film 14 may discontinuously extend between the lower surface 14a and the upper surface 14b of the insulating film 14. For example, the upper surface 14b of the insulating film 14 may be defined as an imaginary surface (or plane) including the perimeter of the upper end of the insulating film 14. The lower surface 14a of the insulating film 14 may be defined as an imaginary surface including the perimeter of the lower end of the insulating film 14.

The lower surface 14a of the insulating film 14 may be disposed on a same surface (or a same line) as the lower surface 11a (e.g., the outer surface) of the first semiconductor layer 11. The upper surface 14b of the insulating film 14 may be disposed on a same surface (or a same line) as the upper surface 18b (e.g., the outer surface) of the fourth semiconductor layer 18. The lower surface 14a of the insulating film 14 and the lower surface 11a (e.g., the outer surface) of the first semiconductor layer 11 may not be always disposed on a same surface (or a same line), and may be disposed on different surfaces (e.g., different lines), in some embodiments. For example, the upper surface 14b of the insulating film 14 and the upper surface 18b (e.g., the outer surface) of the fourth semiconductor layer 18 may not be always disposed on a same surface (or a same line), and may be disposed on different surfaces (e.g., different lines), in some embodiments.

The first semiconductor layer 11, the active layer 12, the second semiconductor layer 13, the third semiconductor layer 15 (e.g., the tunneling junction layer), and the fourth semiconductor layer 18 that are sequentially stacked in the longitudinal direction L of the light emitting element LD may have different thicknesses, but embodiments not limited thereto.

In an embodiment, based on a surface 15c (hereinafter, referred to as 'contact surface') on which the upper surface 16b of the third-first semiconductor layer 16 and the lower surface 17a of the third-second semiconductor layer 17 contact each other, different types of semiconductor layers may have different thicknesses. In detail, with respect to the longitudinal direction L of the light emitting element LD, a sum d1 (hereinafter, referred to as 'first thickness') as the thickness of the second semiconductor layer 13 and the third-first semiconductor layer 16 that are disposed under the contact surface 15c may differ from a sum d2 (hereinafter, referred to as 'second thickness') as the thickness of the third-second semiconductor layer 17 and the fourth semiconductor layer 18 that are disposed over the contact surface 15c. For example, the second thickness d2 may be greater than the first thickness d1.

In an embodiment, the thickness of the fourth semiconductor layer 18 that is disposed on the upper end of the light emitting element LD may be adjusted such that the second thickness d2 is greater than the first thickness d1 with respect to the longitudinal direction L of the light emitting element LD. With respect to the longitudinal direction L of the light emitting element LD, the fourth semiconductor layer 18 may have a thickness greater than that of each of the second semiconductor layer 13 and the third semiconductor layer 15 and less than that of the first semiconductor layer 11. However, embodiments are not limited thereto. In an embodiment, the fourth semiconductor layer 18 may have a same thickness as that of the first semiconductor layer 11.

With respect to the longitudinal direction L of the light emitting element LD, a distance from the contact surface 15c to the upper surface LD_2 of the light emitting element LD and/or the upper surface of the light emitting stacked pattern 10 may differ from a distance from the contact surface 15c to the lower surface LD_1 of the light emitting element LD and/or the lower surface of the light emitting stacked pattern 10. For example, with respect to the longitudinal direction L of the light emitting element LD, the distance from the contact surface 15c to the upper surface LD_2 of the light emitting element LD and/or the upper surface of the light emitting stacked pattern 10 may be less than the distance from the contact surface 15c to the lower surface LD_1 of the light emitting element LD and/or the lower surface of the light emitting stacked pattern 10. For example, with respect to the longitudinal direction L of the light emitting element LD, the distance from the contact surface 15c to the upper surface 18b (e.g., the outer surface) of the fourth semiconductor layer 18 may be less than the distance from the contact surface 15c to the lower surface 11a (e.g., the outer surface) of the first semiconductor layer 11. In an embodiment, the contact surface 15c may be disposed over a point corresponding to a half of the entire length L of the light emitting element LD and/or the light emitting stacked pattern 10 with respect to the longitudinal direction L of the light emitting element LD. For example, the contact surface 15c may be disposed closer to the upper surface 18b (e.g., the outer surface) of the fourth semiconductor layer 18 than to the lower surface 11a (e.g., the outer surface) of the first semiconductor layer 11, based on the point corresponding to the half of the entire length L of the light emitting element LD with respect to the longitudinal direction L of the light emitting element LD.

As described above, in case that the thickness d2 of the n-type semiconductor layers (for example, the third-second semiconductor layer 17 and the fourth semiconductor layer 18) that are disposed over the contact surface 15c with respect to the longitudinal direction L of the light emitting element LD is greater than the thickness d1 of the p-type semiconductor layers (for example, the third-first semiconductor layer 16 and the second semiconductor layer 13) that are disposed under the contact surface 15c, and the contact surface 15c is disposed adjacent to the upper surface 18b (e.g., the outer surface) of the fourth semiconductor layer 18 based on the point corresponding to the half of the entire length L of the light emitting element LD, the active layer 12 may be disposed in an intermediate (e.g., central) portion of the light emitting element LD or disposed adjacent to the intermediate (e.g., central) portion of the light emitting element LD.

The fourth semiconductor layer 18 may be provided and/or formed on the third semiconductor layer 15 (e.g., the tunneling junction layer) by a typical growth method. For example, the fourth semiconductor layer 18 having a certain level or more of thickness may be formed on the third semiconductor layer 15 (e.g., the tunneling junction layer) by adjusting conditions for the growth. In case that the fourth semiconductor layer 18 has a certain level or more of thickness, the length L of the light emitting element LD may be increased by the thickness of the fourth semiconductor layer 18. Hence, the active layer 12 may be substantially disposed in the intermediate (e.g., central) portion of the light emitting element LD with respect to the longitudinal direction L of the light emitting element LD or disposed adjacent to the intermediate (e.g., central) portion of the light emitting element LD.

As described above, in case that the active layer 12 may be substantially disposed in the intermediate (e.g., central) portion of the light emitting element LD with respect to the longitudinal direction L of the light emitting element LD or disposed adjacent to the intermediate (e.g., central) portion of the light emitting element LD, light emitted from the active layer 12 may uniformly (or evenly) travel toward the opposite ends of the light emitting element LD rather than being biased or shifted to one side. Hence, the intensities of light emitted from the opposite ends of the light emitting element LD may be uniform. Thus, the optical efficiency of the light emitting element LD may be enhanced.

When the active layer 12 is disposed at a position biased or shifted to one end of the opposite ends of the light emitting element LD rather than being disposed at the intermediate (e.g., central) portion of the light emitting element LD, light emitted from the active layer 12 may be focused on the one end. In this case, light emitted from the light emitting element LD may be biased or shifted to one side, and light may be asymmetrically output from the light emitting element LD. In an embodiment, the thickness d2 of the n-type semiconductor layers disposed over the contact surface 15c with respect to the longitudinal direction L of the light emitting element LD may be greater than the thickness d1 of the p-type semiconductor layers disposed under the contact surface 15c, so that the active layer 12 may be disposed in the intermediate (e.g., central) portion of the light emitting element LD or disposed adjacent to the intermediate (e.g., central) portion, whereby light emitted from the active layer 12 may uniformly travel or transmit to the opposite ends of the light emitting element LD. Consequently, in accordance with an embodiment, the light output efficiency of the light emitting element LD may be enhanced.

Furthermore, in an embodiment, with respect to the longitudinal direction L of the light emitting element LD, the first semiconductor layer 11 including an n-type semiconductor layer may be disposed on one end of the light emitting element LD, and the fourth semiconductor layer 18 including an n-type semiconductor layer may be disposed on a remaining end of the light emitting element LD. The n-type semiconductor layers may be respectively disposed on the opposite ends of the light emitting element LD with respect to the longitudinal direction L of the light emitting element LD, so that the electrical properties of the light emitting element LD may be enhanced. Generally, the n-type semiconductor layers have material properties of high light transmissivity and excellent electrical properties due to high electron mobility (e.g, low resistance). Therefore, when the n-type semiconductor layers (for example, the first semiconductor layer 11 and the fourth semiconductor layer 18) are disposed on the opposite ends of the light emitting element LD, and signals (e.g., voltages) are applied to the opposite ends of the light emitting element LD, electron-hole pairs may be more rapidly coupled or combined in the active layer 12 of the light emitting element LD, so that loss of light emitted from the active layer 12 may be minimized. Consequently, the light output efficiency of the light emitting element LD may be further enhanced.

The light emitting element LD may be employed as a light source for various display devices. The light emitting element LD may be formed through a surface treatment process. For example, each light emitting element LD may be surface-treated so that, when a plurality of light emitting elements LD are mixed with a fluidic solution (e.g., solvent) and then supplied to each emission area (for example, an emission area of each pixel or an emission area of each sub-pixel), the light emitting elements LD may be evenly distributed rather than unevenly aggregating in the solution.

A light emitting device including the light emitting element LD described above may be used not only in a display device but also in various devices having a light source. For instance, in case that a plurality of light emitting elements LD are disposed in the pixel area of each pixel of a display panel, the light emitting elements LD may be used as a light source of the pixel. However, the application field of the light emitting element LD is not limited to the above-mentioned examples. For example, the light emitting element LD may also be used in other types of devices such as a lighting device having a light source.

FIGS. 3A, 3B, 3C, 3D, 3E, 3F, 3G, 3H, 3I, 3J, and 3K are schematic cross-sectional views sequentially illustrating a method of fabricating or manufacturing the light emitting element of FIGS. 1 and 2.

Referring to FIGS. 1 to 3A, a substrate 1 configured to support the light emitting element LD is prepared.

The substrate 1 may be a GaAs, GaP, or InP substrate. The substrate 1 may be a wafer for epitaxial growth. The substrate 1 may include a ZnO substrate having a GaAs layer on a surface thereof. Furthermore, a Ge substrate having a GaAs layer on a surface thereof and a Si substrate having a GaAs layer on an Si wafer with a buffer layer interposed between the GaAs layer and the Si wafer may also be used.

A single-crystal substrate, which is formed through a well-known fabricating method and is an article on the market, may be used as the substrate 1. In case that a selectivity for fabricating the light emitting element LD is satisfied and the epitaxial growth is smoothly performed, the material of the substrate 1 is not limited thereto.

It is desirable that a surface of the substrate 1 on which the epitaxial growth is performed be planar. The substrate 1 may be changed in size and diameter according to a product to which the substrate 1 is to be applied, and may be formed in a shape capable of mitigating a bending phenomenon by a stacked structure due to the epitaxial growth. The shape of the substrate 1 is not limited to a circular shape, and it may have a polygonal shape such as a rectangular shape.

Subsequently, a sacrificial layer 3 is formed on the substrate 1. The sacrificial layer 3 may be disposed between the light emitting element LD and the substrate 1 during a process of fabricating the light emitting element LD on the substrate 1 so that the light emitting element LD may be physically spaced apart from the substrate 1.

The sacrificial layer 3 may have various types of structures, and may have a single layer structure or a multilayer structure. The sacrificial layer 3 may be a layer that is to be removed in a last step of the process of fabricating the light emitting element LD. In case that the sacrificial layer 3 is removed, layers disposed over and under the sacrificial layer 3 may be separated from each other.

The sacrificial layer 3 may be formed of GaAs, AlAs, or AlGaAs.

The first semiconductor layer 11 is formed on the sacrificial layer 3. The first semiconductor layer 11 may be formed through epitaxial growth, and may be formed by a metal-organic chemical vapor deposition (MOCVD) method, a molecular beam epitaxy (MBE) method, a vapor phase epitaxy (VPE) method, a liquid phase epitaxy (LPE) method, or the like. In an embodiment, an additional semiconductor layer such as a buffer layer or an undoped semiconductor layer for enhancing crystallizability may be further formed between the first semiconductor layer 11 and the sacrificial layer 3.

The first semiconductor layer 11 may include a semiconductor layer formed of the III (Ga, Al, In)—V(P, As) group and doped with a first conductive dopant (e.g., an n-type dopant) such as Si, Ge, and Sn. For example, the first semiconductor layer 11 may include at least one semiconductor material of GaP, GaAs, GaInP, and AlGaInP, doped with Si. For example, the first semiconductor layer 11 may include at least one n-type semiconductor layer.

Referring to FIGS. 1 to 3B, the active layer 12 may be formed on the first semiconductor layer 11. The active layer 12 may be an area in which electrons and holes are re-coupled or recombined to each other, and the re-coupling of the electrons and the holes may cause an energy level transition to a lower energy level. Thus, light having a wavelength corresponding to the energy level transition may be emitted. The active layer 12 may be formed on the first semiconductor layer 11 and have a single or multiple quantum well structure. The location of the active layer 12 may be changed in various ways according to the type of the light emitting element LD. In an embodiment, the active layer 12 may be disposed in the intermediate (e.g., central) portion of the light emitting element LD with respect to the longitudinal direction L thereof.

The active layer 12 may include at least one material of GaInP, AlGaInP, GaAs, AlGaAs, InGaAs, InGaAsP, InP, and InAs. The active layer 12 may emit light having a wavelength in a range of about 400 nm to about 900 nm. The active layer 12 may have a double hetero structure. In an embodiment, a clad layer doped with a conductive dopant may be further formed on the second surface 12b and/or the first surface 12a of the active layer 12. In an embodiment, a tensile strain barrier reducing (TSBR) layer may be further formed on the second surface 12b of the active layer 12. For example, the TSBR layer may be disposed between the second surface 12b of the active layer 12 and the lower surface 13a of the second semiconductor layer 13. Furthermore, in an embodiment, the TSBR layer may be disposed on the upper surface 17b of the third-second semiconductor layer 17 of the third semiconductor layer 15.

Referring to FIGS. 1 to 3C, the second semiconductor layer 13 is formed on the active layer 12. The second semiconductor layer 13 may include a semiconductor layer of a type different from that of the first semiconductor layer 11. The second semiconductor layer 13 may include semiconductor layer formed of the III (Ga, Al, In)—V(P, As)

group and doped with a second conductive dopant (e.g., a p-type dopant) such as Mg. For example, the second semiconductor layer 13 may include at least one semiconductor material of GaP, GaAs, GaInP, and AlGaInP, doped with Mg. For example, the second semiconductor layer 13 may include a p-type semiconductor layer.

Referring to FIGS. 1 to 3D, the third-first semiconductor layer 16, which is made of a semiconductor layer of a same type as that of the second semiconductor layer 13, may be formed on the second semiconductor layer 13. Thereafter, the third-second semiconductor layer 17 made of a semiconductor layer of a type different from that of the third-first semiconductor layer 16 is formed on the third-first semiconductor layer 16. The third-first semiconductor layer 16 and the third-second semiconductor layer 17 that are made of different types of semiconductor layers may form the third semiconductor layer 15 that is a tunneling junction layer.

In an embodiment, the third-first semiconductor layer 16 may be a p-type semiconductor layer, and include semiconductor material doped with a second conductive dopant (e.g., a p-type dopant) having a concentration higher than that of the second semiconductor layer 13. The third-second semiconductor layer 17 may be an n-type semiconductor layer, and include semiconductor material doped with a first conductive dopant (e.g., an n-type dopant) having a concentration higher than that of the first semiconductor layer 11.

Referring to FIGS. 1 to 3E, the fourth semiconductor layer 18 made of a semiconductor layer of a same type as that of the third-second semiconductor layer 17 is formed on the third-second semiconductor layer 17. The fourth semiconductor layer 18 may be an n-type semiconductor layer, and include semiconductor material doped with a first conductive dopant (e.g., an n-type dopant) having a concentration lower than that of the third-second semiconductor layer 17.

The fourth semiconductor layer 18 may be formed through epitaxial growth, and may be formed by a metal-organic chemical vapor deposition (MOCVD) method, a molecular beam epitaxy (MBE) method, a vapor phase epitaxy (VPE) method, a liquid phase epitaxy (LPE) method, or the like. When the fourth semiconductor layer 18 is formed on the third-second semiconductor layer 17, the fourth semiconductor layer 18 having a certain level or more of thickness may be formed on the third-second semiconductor layer 17 by adjusting growth conditions or the like.

The first semiconductor layer 11, the active layer 12, the second semiconductor layer 13, the third semiconductor layer 15 (e.g., the tunneling junction layer), and the fourth semiconductor layer 18 that are sequentially stacked on the substrate 1 may form a light emitting stack 10'.

Referring to FIGS. 1 to 3F, a mask layer 20 is formed on the fourth semiconductor layer 18. The mask layer 20 may include an insulating layer and a metal layer. The insulating layer may be formed on the fourth semiconductor layer 18. The insulating layer may function as a mask for sequentially etching the light emitting stack 10'. The insulating layer may be formed of oxide or nitride and, for example, include silicon oxide ($SiO_x$), silicon nitride ($SiN_x$), or the like. Although the insulating layer has a thickness in a range of about 0.5 μm to about 1.5 μm, embodiments are not limited thereto. The metal layer may include metal such as chromium (Cr), but it is not limited thereto. The metal layer may have a thickness in a range of about 30 nm to about 150 nm.

At least one fine pattern FP may be formed on the mask layer 20. The fine pattern FP may be formed using a polymer layer. The fine pattern FP may be formed by forming the polymer layer on the mask layer 20, and forming a pattern in the polymer layer at nanoscale or microscale intervals. For example, the fine pattern FP may be formed at nanoscale or microscale intervals by patterning the polymer layer on the mask layer 20 by a method such as photo-lithography method, electron beam lithography, or nanoimprint lithography (NIL).

Referring to FIGS. 1 to 3G, a mask pattern 20' is formed by patterning the mask layer 20 using the fine pattern FP as a mask. The mask pattern 20' may be formed in a shape corresponding to the fine pattern FP. The mask pattern 20' may be used as an etching mask for forming the light emitting stacked pattern 10 by etching the light emitting stack 10'. The fine pattern FP may be removed by a typical wet or dry etching method, or the like, but embodiments are not limited thereto, and it may be removed by typical removal methods.

Referring to FIGS. 1 to 3H, a plurality of light emitting stacked patterns 10 are formed by patterning the light emitting stack 10' at nanoscale or microscale intervals by performing an etching process by using the mask pattern 20' as an etching mask.

During the foregoing etching process, an area of the light emitting stack 10' that does not correspond to the mask pattern 20' may be etched so that a recess HM that exposes an area A of the first semiconductor layer 11 may be formed. An area of the light emitting stack 10' that corresponds to the mask pattern 20' is not etched.

The recess HM may have a shape that is recessed from the upper surface 18b of the fourth semiconductor layer 18 of each light emitting stacked pattern 10 to the area A of the first semiconductor layer 11 in one direction (for example, in a vertical direction or a stacking direction).

A dry etching method such as a reactive ion etching (RIE) method, a reactive ion beam etching (RIBE) method, or an inductively coupled plasma reactive ion etching (ICP-RIE) method may be used as an etching method for forming the plurality of light emitting stacked patterns 10. Unlike a wet etching method, the dry etching method may perform an anisotropic etching process and thus is suitable for forming the light emitting stacked patterns 10. For example, the wet etching method may be performed in an isotropic etching scheme, so that a target may be etched in all directions. Unlike this, the dry etching method may perform an etching process in such a way that the target is etched mainly in a depth direction to form the recess HM, whereby recesses HM may be formed in a desired pattern in size, interval, etc.

In an embodiment, each of the light emitting stacked patterns 10 may have a nanoscale or microscale size.

After the foregoing etching process is performed, residues that remain on the light emitting stacked patterns 10 (e.g., particularly, residues of the mask pattern 20') may be removed by a typical wet etching or dry etching method, but it is not limited thereto. The residues may be removed by typical removal methods. For example, the mask pattern 20' (e.g., the residues) may include an etching mask, insulating material, and the like, needed to perform the mask process.

Referring to FIGS. 1 to 3I, an insulating layer 14' is formed on the light emitting stacked pattern 10 and the area A of the first semiconductor layer 11. The insulating layer 14' may include an upper insulating layer, a side insulating layer, and a lower insulating layer. The upper insulating layer may completely (or partially) cover respective upper surfaces of the light emitting stacked patterns 10. For example, the upper surface of each of the light emitting stacked patterns 10 may correspond to the upper surface 18b (e.g., the outer surface) of the fourth semiconductor layer 18. For example, the upper insulating layer may completely (or partially) cover the upper surfaces 18b of the respective fourth semiconductor layers 18 of the light emitting stacked patterns 10. The side insulating layer may completely (or partially) cover respective side surfaces of the light emitting stacked patterns 10. The lower insulating layer may completely (or partially) cover the area A of the first semiconductor layer 11 that is exposed to the outside through the recess HM.

The upper insulating layer, the side insulating layer, and the lower insulating layer may be connected to each other on the substrate 1 and be continuously extended to each other.

A method of applying insulating material onto the light emitting stacked patterns 10 attached to the substrate 1 may be used as a method of forming the insulating layer 14', but embodiments are not limited thereto. Material used as the insulating layer 14' may include any one or more selected from the group consisting of silicon oxide ($SiO_x$), silicon nitride ($SiN_x$), aluminium oxide ($AlO_x$), titanium dioxide ($TiO_2$), and the like, but embodiments are not limited thereto. For example, in case that the insulating layer 14' includes aluminium oxide ($AlO_x$), the insulating layer 14' may be formed by an atomic layer deposition (ALD) scheme, and a thin film may be formed through a chemical absorption and desorption process by supplying trimethyl aluminum (TMA) and a H2O source in the form of pulse. The insulating layer 14' may have a thickness in a range of about 30 nm to about 150 nm, but embodiments are not limited thereto.

Referring to FIGS. 1 to 3J, the insulating film 14 is formed by removing a portion of the insulating layer 14' formed on the substrate 1 through an etching process.

The upper insulating layer and the lower insulating layer are removed through the etching process of forming the insulating film 14. Eventually, the insulating film 14 including only the side insulating layer that covers the side surface of each light emitting stacked pattern 10 may be formed. During the foregoing etching process, the upper insulating layer is removed, so that the upper surface 18b of the fourth semiconductor layer 18 may be exposed. For example, the upper surface 14b of the insulating film 14 may be provided and/or formed on a same surface (or a same line) as that of the upper surface 18b (e.g., the outer surface) of the fourth semiconductor layer 18. Furthermore, the lower insulating layer is removed through the foregoing etching process, so that the area A of the first semiconductor layer 11 may be exposed to the outside.

A plurality of light emitting elements LD including the light emitting stacked patterns 10 and the insulating film 14 that encloses respective outer circumferential surfaces (or respective surfaces) of the light emitting stacked patterns 10 may be eventually formed through the foregoing etching process. For example, the upper surface 18b (e.g, the outer surface) of the fourth semiconductor layer 18 that is exposed to the outside may become the upper surface LD_2 of each of the light emitting elements LD.

Referring to FIGS. 1 to 3K, the light emitting elements LD are separated from the substrate 1 by a physical lift-off method including forming space between the light emitting elements LD and the substrate 1 and applying small physical force or impact thereto. For example, the lower surface 11a of the first semiconductor layer 11 of each of the light emitting elements LD may be exposed to the outside.

The method of separating the light emitting elements LD from the substrate 1 is not limited to the foregoing embodiment. In an embodiment, the light emitting elements LD may be separated from the substrate 1 by a laser lift-off (LLO) method using a laser, a chemical lift-off (CLO) method using an etchant solution, or the like.

In each of the light emitting elements LD that are eventually fabricated through the foregoing fabrication process, the n-type semiconductor layers (e.g., the third-second semiconductor layer 17 and the fourth semiconductor layer 18) that are disposed over the contact surface 15c with respect to the longitudinal direction L of each light emitting element LD may have a thickness d2 greater than that of the p-type semiconductor layers (e.g., the second semiconductor layer 13 and the third-first semiconductor layer 16) that are disposed under the contact surface 15c.

Furthermore, each of the light emitting elements LD that are eventually formed through the foregoing fabrication process may include the active layer 12 that is disposed in the intermediate (e.g., central) portion of the light emitting element LD with respect to the longitudinal direction L of each light emitting element LD or disposed adjacent to the intermediate (e.g., central) portion.

Figure 4:
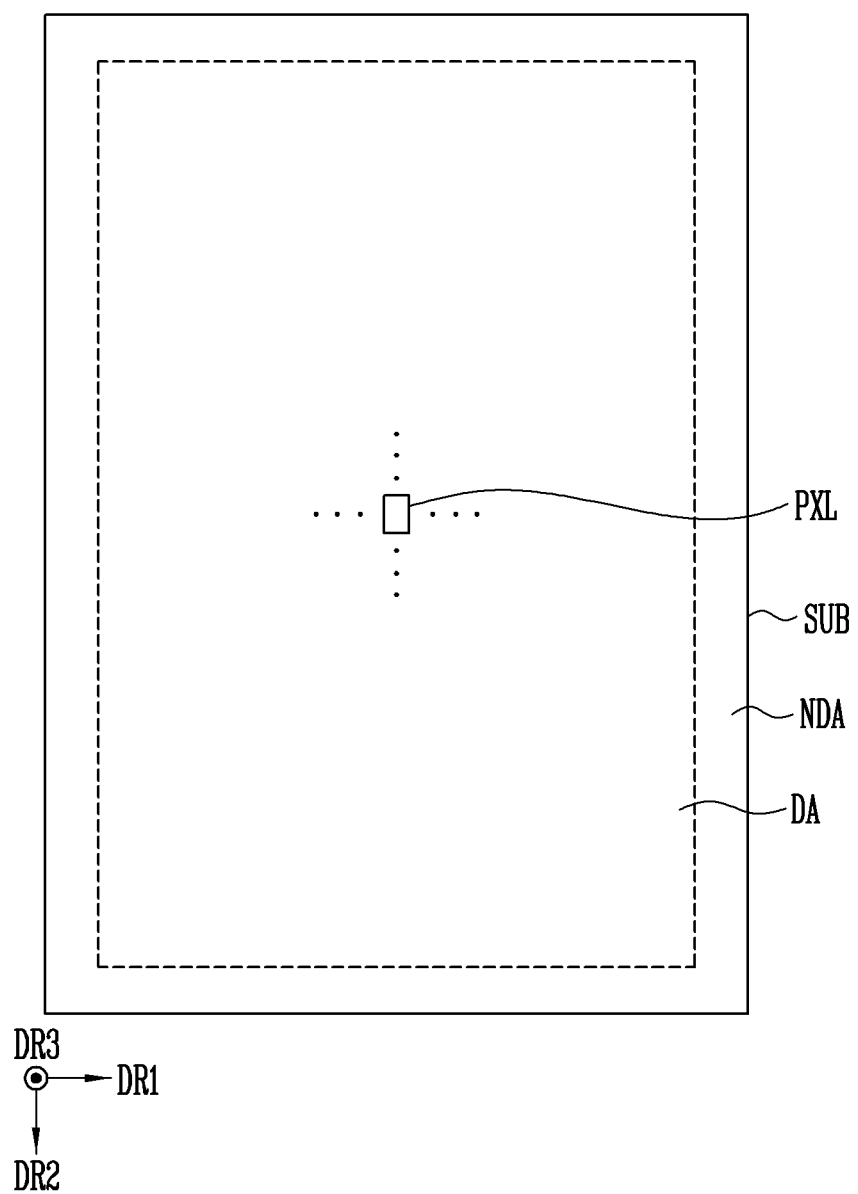
FIG. 4 illustrates a display device in accordance with an embodiment, and particularly, is a schematic plan view illustrating a display device using the light emitting element illustrated in FIGS. 1 and 2, as a light emitting source.

FIG. 4 illustrates a display device in accordance with an embodiment, and particularly, is a schematic plan view illustrating a display device using the light emitting element illustrated in FIGS. 1 and 2, as a light emitting source.

For the sake of explanation, FIG. 4 schematically illustrates the structure of the display device, focused on a display area in which an image is displayed. In some embodiments, at least one driver (for example, a scan driver and a data driver) and/or a plurality of lines may be further disposed in the display device.

Referring to FIGS. 1 to 4, the display device in accordance with the embodiment may include a substrate SUB, a plurality of pixels PXL disposed on the substrate SUB and each including at least one light emitting element LD, a driver disposed on the substrate SUB and configured to drive the pixels PXL, and a line component for connecting the pixels PXL to the driver.

The display device may be classified into a passive matrix type display device and an active matrix type display device according to a method of driving the light emitting element LD. For example, in case that the display device is implemented as an active matrix type display device, each of the pixels PXL may include a driving transistor configured to control the amount of current to be supplied to the light emitting element LD, and a switching transistor configured to transmit a data signal to the driving transistor.

Recently, active-matrix type display devices, which are capable of selectively turning on each pixel PXL based on the resolution, the contrast, and the working speed have been mainstreamed or mainly used. However, embodiments are not limited thereto. For example, passive-matrix type display devices, in which pixels PXL may be turned on by groups may also include components (for example, first and second electrodes) for driving the light emitting element LD.

The substrate SUB may include a display area DA and a non-display area NDA.

In an embodiment, the display area DA may be disposed in a central area of the display device, and the non-display area NDA may be disposed in a perimeter area of the display device in such a way as to enclose the display area DA. The locations of the display area DA and the non-display area NDA are not limited thereto, and the locations thereof may be varied or modified.

The display area DA may be an area in which the pixels PXL for displaying an image are disposed. The non-display area NDA may be an area in which the driver configured to drive the pixels PXL and a portion of the line component for connecting the pixels PXL to the driver are disposed.

The display area DA may have various shapes. For example, the display area DA may have a closed polygonal shape including linear sides. In another embodiment, the display area DA may have a circular and/or elliptical shape including a curved side. In another embodiment, the display area DA may have various shapes such as a semi-circular shape and a semi-elliptical shape including a linear side and a curved side.

The non-display area NDA may be disposed on at least one side of the display area DA. In an embodiment, the non-display area NDA may enclose the periphery (e.g., the edge) of the display area DA.

The line component connected to the pixels PXL, and the driver connected to the line component and configured to drive the pixels PXL may be disposed in the non-display area NDA.

The line component may electrically connect the driver with the pixels PXL. The line component may be a fan-out line connected to signal lines, for example, a scan line, a data line, and an emission control line, which are connected to each pixel PXL to provide signals to the pixel PXL.

The substrate SUB may include transparent insulating material to allow transmit light. The substrate SUB may be a rigid substrate or a flexible substrate.

One area on the substrate SUB may be provided as the display area DA in which the pixels PXL are disposed, and the other area thereof may be provided as the non-display area NDA. For example, the substrate SUB may include the display area DA including a plurality of pixel areas in which the respective pixels PXL are formed, and the non-display area NDA disposed around the display area DA.

The pixels PXL may be disposed in the display area DA on the substrate SUB. In an embodiment, the pixels PXL may be arranged in the display area DA in a stripe or PENTILE® arrangement structure, but embodiments are not limited thereto.

Each of the pixels PXL may include at least one or more light emitting elements LD configured to be driven in response to a corresponding scan signal and a corresponding data signal. The light emitting element LD may have a small size corresponding to the micro scale or the nano scale and be connected in parallel to light emitting elements disposed adjacent thereto, but embodiments are not limited thereto. The light emitting element LD may form a light source of each pixel PXL.

Each of the pixels PXL may include at least one light source which is driven by a signal (for example, a scan signal and a data signal) and/or a power supply (for example, a first driving power supply and a second driving power supply). For example, each of the pixels PXL may include a light emitting element LD illustrated in FIGS. 1 and 2, for example, at least one subminiature light emitting element LD having a small size in a range of the nano scale to the micro scale. However, in embodiments of the present disclosure, the type of light emitting element LD which may be used as a light source of each of the pixels PXL is not limited thereto.

In an embodiment, the color, the type, and/or the number of pixels PXL are not particularly limited. For example, the color of light emitted from each pixel PXL may be changed in various ways.

The driver may provide a signal and a power voltage to each of the pixels PXL through the line component and thus control the operation of the pixel PXL.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

FIGS. 5A to 5E are circuit diagrams illustrating various embodiments of an electrical connection relationship of components included in one pixel illustrated in FIG. 4.

For example, FIGS. 5A to 5E illustrate other embodiments of the electrical connection relationship of components included in a pixel PXL which may be employed in an active display device. However, the types of the components included in the pixel PXL to which embodiments of the present disclosure may be applied are not limited thereto.

In FIGS. 5A to 5E, not only the components included in each of the pixels illustrated in FIG. 4 but also an area in which the components are provided is included in the definition of the term "pixel PXL". In an embodiment, each pixel PXL illustrated in FIGS. 5A to 5E may be any one of the pixels PXL disposed in the display device of FIG. 4. The pixels PXL may have structures substantially equal or similar to each other.

Referring to FIGS. 1 to 4, and 5A to 5E, each pixel PXL (hereinafter referred to as 'pixel') may include an emission unit EMU configured to generate light having a luminance corresponding to a data signal. The pixel PXL may selectively further include a pixel circuit 144 configured to drive the emission unit EMU.

In an embodiment, the emission unit EMU may include a plurality of light emitting elements LD connected in parallel between a first power supply line PL1 to which a voltage of a first driving power supply VDD is to be applied, and a second power supply line PL2 to which a voltage of a second driving power supply VSS is to be applied. For example, the emission unit EMU may include a first electrode EL1 (referred to as "first alignment electrode") connected to the first driving power supply VDD via the pixel circuit 144 and the first power supply line PL1, a second electrode EL2 (referred to as "second alignment electrode") connected to the second driving power supply VSS through the second power supply line PL2, and a plurality of light emitting elements LD connected in parallel to each other in a same direction between the first and second electrodes EL1 and EL2. In an embodiment, the first electrode EL1 may be an anode electrode, and the second electrode EL2 may be a cathode electrode.

In an embodiment, each of the light emitting elements LD included in the emission unit EMU may include a first end connected to the first driving power supply VDD through the first electrode EL1, and a second end connected to the second driving power supply VSS through the second electrode EL2. The first driving power supply VDD and the second driving power supply VSS may have different potentials. For example, the first driving power supply VDD may be set as a high-potential power supply, and the second driving power supply VSS may be set as a low-potential power supply. For example, a difference in potential (or voltage difference) between the first and second driving power supplies VDD and VSS may be set to a value equal to or greater than a threshold voltage of the light emitting elements LD during an emission period of the pixel PXL.

As described above, the light emitting elements LD that are connected in parallel to each other in a same direction (for example, in a forward direction) between the first electrode EL1 and the second electrode EL2 to which voltages having different potentials are respectively supplied may form respective valid light sources. The valid light sources may be gathered to form the emission unit EMU of the pixel PXL.

The light emitting elements LD of the emission unit EMU may emit light having a luminance corresponding to driving current supplied thereto through the pixel circuit 144. For example, during each frame period, the pixel circuit 144 may supply driving current corresponding to a gray scale of corresponding frame data to the emission unit EMU. The driving current supplied to the emission unit EMU may be divided into parts which flow into the respective light emitting elements LD. Hence, each of the light emitting elements LD may emit light having a luminance corresponding to current applied thereto, so that the emission unit EMU may emit light having a luminance corresponding to the driving current.

Figure 5A:
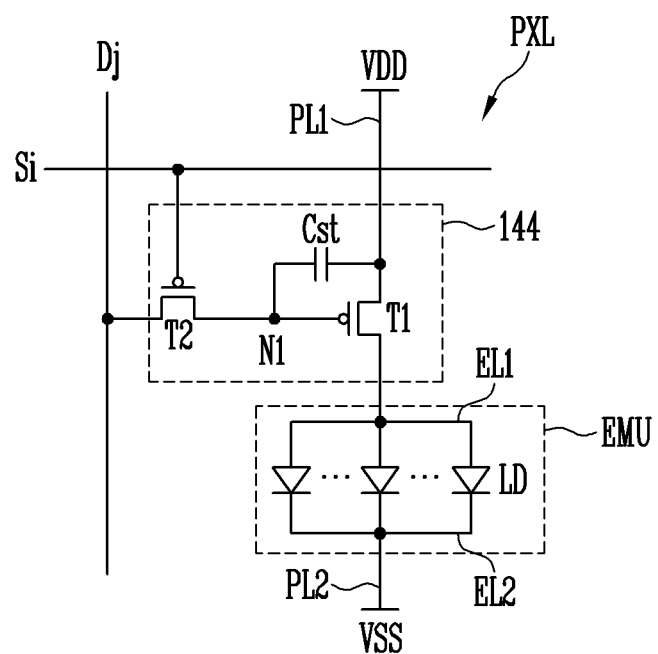
FIGS. 5A, 5B, 5C, 5D, and 5E are circuit diagrams illustrating various embodiments of an electrical connection relationship of components included in one pixel illustrated in FIG. 4.
Figure 5B:
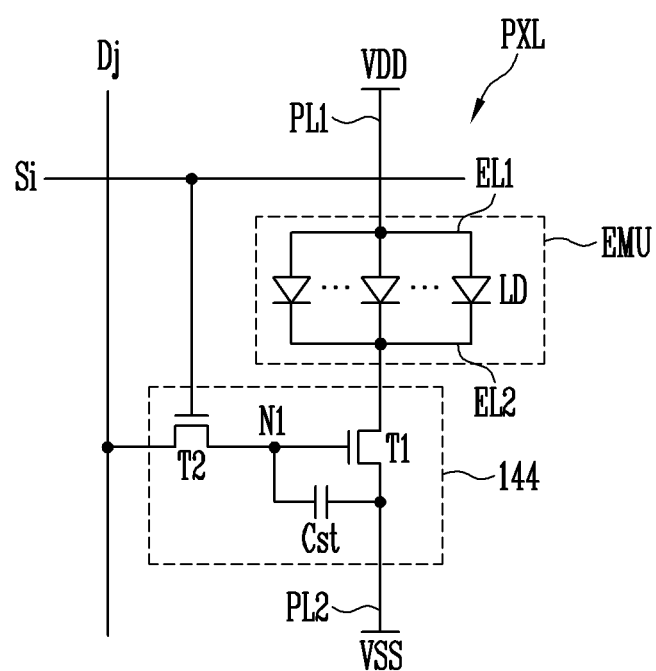
Figure 5C:
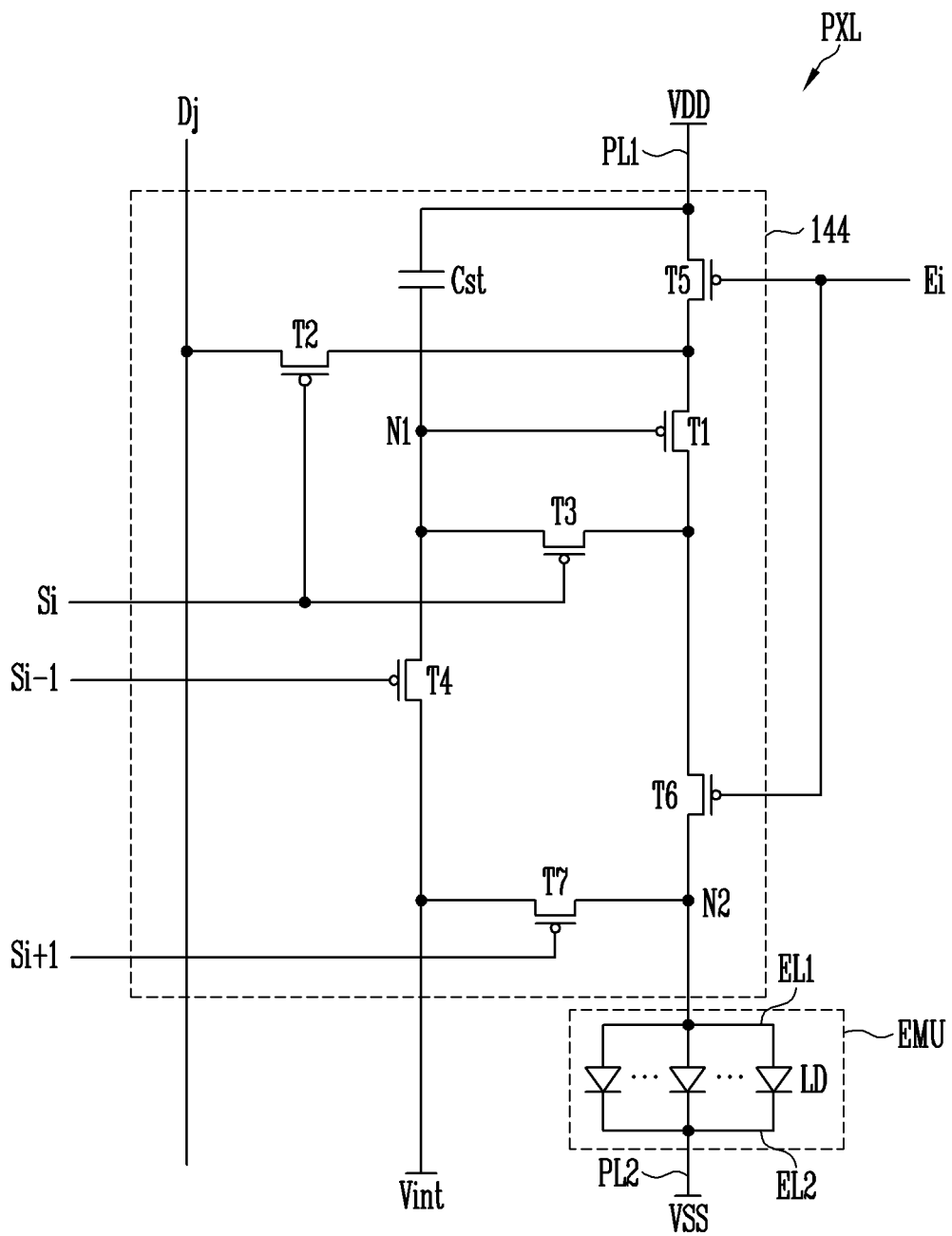
Figure 5D:
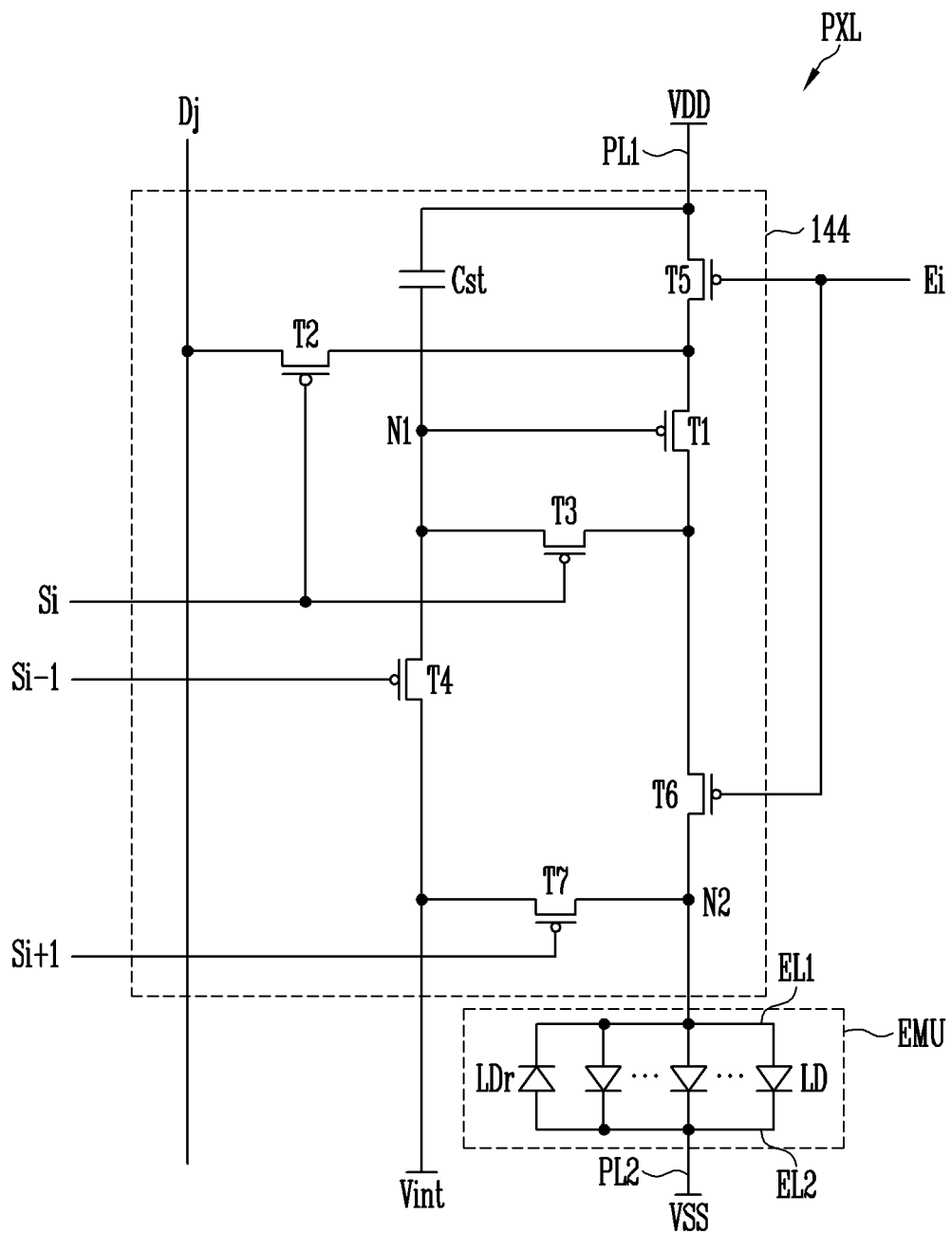
Figure 5E:
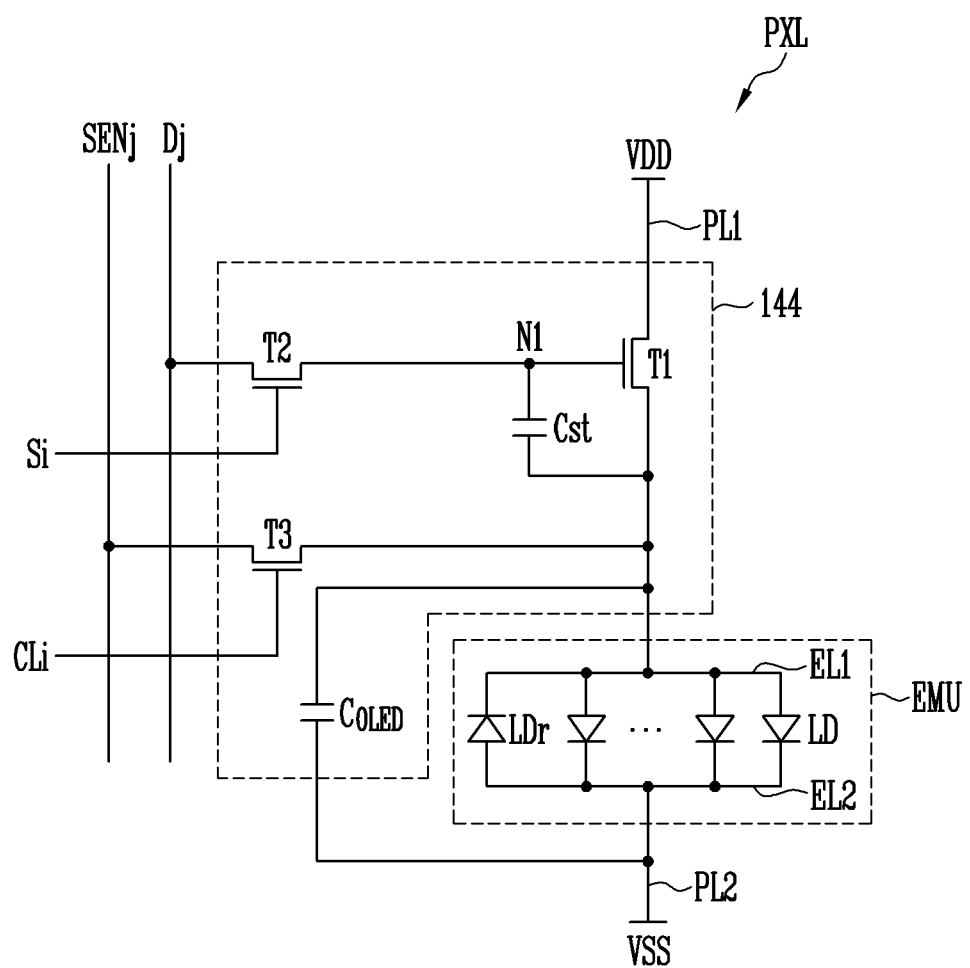

Although FIGS. 5A to 5E illustrate embodiments in which the opposite ends of the light emitting elements LD are connected in a same direction between the first and second driving power supplies VDD and VSS, embodiments are not limited thereto. In an embodiment, the emission unit EMU may further include at least one invalid (e.g., defective) light source, as well as the light emitting elements LD that form the respective valid light sources. For example, as illustrated in FIGS. 5D and 5E, at least a reverse bias light emitting element LDr may be further connected between the first and second electrodes EL1 and EL2 of the emission unit EMU. The reverse bias light emitting element LDr, along with the light emitting elements LD that form the valid light sources, may be connected in parallel to each other between the first and second electrodes EL1 and EL2. For example, the reverse bias light emitting element LDr may be connected between the first and second electrodes EL1 and EL2 in a direction opposite to that of the light emitting elements LD. For example, a capacitor $C_{OLED}$ may be connected between the first and second electrodes EL1 and EL2 of the emission unit EMU. Even when a certain driving voltage (for example, a forward bias directional driving voltage) is applied between the first and second electrodes EL1 and EL2, the reverse bias light emitting element LDr remains inactive state. Hence, current substantially does not flow through the reverse bias light emitting element LDr.

The pixel circuit 144 may be connected to a scan line Si and a data line Dj of the corresponding pixel PXL. For example, when the pixel PXL is disposed in an i-th row (i is a natural number) and a j-th column (j is a natural number) of the display area DA, the pixel circuit 144 of the pixel PXL may be connected to an i-th scan line Si and a j-th data line Dj of the display area DA. In an embodiment, the pixel circuit 144 may include first and second transistors T1 and T2, and a storage capacitor Cst, as illustrated in FIGS. 5A and 5B. However, the structure of the pixel circuit 144 is not limited to the embodiments illustrated in FIGS. 5A and 5B.

First, referring to FIG. 5A, the pixel circuit 144 may include first and second transistors T1 and T2, and a storage capacitor Cst.

A first terminal of the second transistor T2 (e.g., switching transistor) may be connected to the data line Dj, and a second terminal thereof may be connected to a first node N1. For example, the first terminal and the second terminal of the second transistor T2 are different terminals, and, for example, when the first terminal is a source electrode, the second terminal is a drain electrode. A gate electrode of the second transistor T2 may be connected to a scan line Si.

When a scan signal having a voltage (for example, a low voltage) for turning on the second transistor T2 is supplied from the scan line Si, the second transistor T2 is turned on to electrically connect the data line Dj with the first node N1. For example, a data signal of a corresponding frame is supplied to the data line Dj, whereby the data signal is transmitted to the first node N1. The data signal transmitted to the first node N1 may be charged or stored in the storage capacitor Cst.

A first terminal of the first transistor T1 (e.g., the driving transistor) may be connected to the first driving power supply VDD, and a second terminal thereof may be electrically connected to the first electrode EL1 for the light emitting elements LD. A gate electrode of the first transistor T1 may be connected to a first node N1. As such, the first transistor T1 may control the amount of driving current to be supplied to the light emitting elements LD in response to the voltage of the first node N1.

One electrode of the storage capacitor Cst may be connected to the first driving power supply VDD, and a remaining electrode thereof may be connected to the first node N1. The storage capacitor Cst is charged with a voltage corresponding to a data signal supplied to the first node N1, and maintains the charged voltage until a data signal of a subsequent frame is supplied.

FIGS. 5A and 5B each illustrate the pixel circuit 144 including the second transistor T2 configured to transmit a data signal to the pixel PXL, the storage capacitor Cst configured to store the data signal, and the first transistor T1 configured to supply driving current corresponding to the data signal to the light emitting elements LD.

However, embodiments are not limited thereto, and the structure of the pixel circuit 144 may be changed in various ways. For example, the pixel circuit 144 may further include at least one transistor element for compensating for the threshold voltage of the first transistor T1, for initializing the first node N1, and/or for controlling an emission time of the light emitting elements LD, or other circuit elements such as a boosting capacitor for boosting the voltage of the first node N1.

Furthermore, although the transistors in FIG. 5A, for example, the first and second transistors T1 and T2, included in the pixel circuit 144 have been illustrated as being P-type transistors, embodiments are not limited thereto. For example, at least one of the first and second transistors T1 and T2 included in the pixel circuit 144 may be implemented as an N-type transistor.

Referring to FIGS. 1 to 4, and 5B, the first and second transistors T1 and T2 in accordance with an embodiment may be implemented as N-type transistors. The configuration and operation of the pixel circuit 144 illustrated in FIG. 5B, other than a change in connection positions of some components due to a change in the type of transistor, are similar to those of the pixel circuit 144 of FIG. 5A. Therefore, descriptions pertaining thereto will be simplified.

In an embodiment, the pixel circuit 144 illustrated in FIG. 5B may include first and second transistors T1 and T2 as N-type transistors, and a storage capacitor Cst. In case that the first and second transistors T1 and T2 are implemented as N-type transistors, the emission unit EMU may be connected between the first driving power supply VDD and the pixel circuit 144 to secure or improve stabilization of the storage capacitor Cst configured to be charged with a voltage corresponding to a data signal supplied to the first node N1. For example, embodiments are not limited thereto. In an embodiment, the emission unit EMU illustrated in FIG. 5B may be connected between the pixel circuit 144 and the second driving power supply VSS. In an embodiment, the configuration of the pixel circuit 144 is not limited to the embodiments illustrated in FIGS. 5A and 5B. For example, the pixel circuit 144 may be configured in a same manner as that of the embodiments illustrated in FIGS. 5C and 5D.

As illustrated in FIGS. 5C and 5D, the pixel circuit 144 may be coupled to a scan line Si and a data line Dj of the pixel PXL. For example, if the pixel PXL is disposed in an i-th row and a j-th column of the display area DA, the pixel circuit 144 of the pixel PXL may be connected to an i-th scan line Si and a j-th data line Dj of the display area DA.

In an embodiment, the pixel circuit 144 may be further connected to at least another scan line. For example, the pixel PXL disposed in the i-th row of the display area DA may be further connected to an i−1-th scan line Si−1 and/or an i+1-th scan line Si+1. In an embodiment, the pixel circuit 144 may be further connected not only to the first and second driving power supplies VDD and VSS but also to a third power supply. For example, the pixel circuit 144 may also be connected to an initialization power supply Vint.

The pixel circuit 144 may include first to seventh transistors T1 to T7, and a storage capacitor Cst.

One electrode, for example, a source electrode, of the first transistor T1 (e.g., driving transistor) may be connected to the first driving power supply VDD via the fifth transistor T5, and another electrode thereof, for example, a drain electrode, may be connected to one ends of light emitting elements LD via the sixth transistor T6. A gate electrode of the first transistor T1 may be connected to a first node N1. The first transistor T1 may control driving current flowing between the first driving power supply VDD and the second driving power supply VSS via the light emitting elements LD in response to the voltage of the first node N1.

The second transistor T2 (e.g., switching transistor) may be connected between the j-th data line Dj connected to the pixel PXL and the source electrode of the first transistor T1. A gate electrode of the second transistor T2 may be connected to the i-th scan line Si connected to the pixel PXL. When a scan signal having a gate-on voltage (for example, a low-level voltage) is supplied from the i-th scan line Si, the second transistor T2 may be turned on to electrically connect the j-th data line Dj to the source electrode of the first transistor T1. Hence, when the second transistor T2 is turned on, a data signal supplied from the j-th data line Dj may be transmitted to the first transistor T1.

The third transistor T3 may be connected between the drain electrode of the first transistor T1 and the first node N1. A gate electrode of the third transistor T3 may be connected to the i-th scan line Si. When a scan signal having a gate-on voltage is supplied from the i-th scan line Si, the third transistor T3 may be turned on to electrically connect the drain electrode of the first transistor T1 to the first node N1.

The fourth transistor T4 may be connected between the first node N1 and an initialization power supply line to which the initialization power supply Vint is to be applied. A gate electrode of the fourth transistor T4 may be connected to a preceding scan line, for example, the i−1-th scan line Si−1. When a scan signal having a gate-on voltage is supplied to the i−1-th scan line Si−1, the fourth transistor T4 may be turned on so that the voltage of the initialization power supply Vint may be transmitted to the first node N1. For example, the initialization power supply Vint may have a voltage equal to or less than the minimum voltage of the data signal.

The fifth transistor T5 may be connected between the first driving power supply VDD and the first transistor T1. A gate electrode of the fifth transistor T5 may be connected to a corresponding emission control line, for example, an i-th emission control line Ei. The fifth transistor T5 may be turned off when an emission control signal having a gate-off voltage is supplied to the i-th emission control line Ei, and may be turned on in other cases.

The sixth transistor T6 may be connected between the first transistor T1 and one end of the light emitting elements LD (e.g., a second node N2). A gate electrode of the sixth transistor T6 may be connected to the i-th emission control line Ei. The sixth transistor T6 may be turned off when an emission control signal having a gate-off voltage is supplied to the i-th emission control line Ei, and may be turned on in other cases.

The seventh transistor T7 may be connected between the initialization power supply line and the one end of the light emitting elements LD (e.g., a second node N2). A gate electrode of the seventh transistor T7 may be connected to any one of scan lines of a subsequent set, for example, to the i+1-th scan line Si+1. When a scan signal having a gate-on voltage is supplied to the i+1-th scan line Si+1, the seventh transistor T7 may be turned on so that the voltage of the initialization power supply Vint may be supplied to the one end of light emitting elements LD.

The storage capacitor Cst may be connected between the first driving power supply VDD and the first node N1. The storage capacitor Cst may store a voltage corresponding both to the data signal applied to the first node N1 during each frame period and to the threshold voltage of the first transistor T1.

Although in FIGS. 5C and 5D the transistors, for example, the first to seventh transistors T1 to T7, included in the pixel circuit 144 have been illustrated as being P-type transistors, embodiments are not limited thereto. For example, at least one of the first to seventh transistors T1 to T7 may be implemented as an N-type transistor.

In an embodiment, the configuration of the pixel circuit 144 is not limited to the embodiments illustrated in FIGS. 5A to 5D. For example, the pixel circuit 144 may be configured in a same manner as that of the embodiment shown in FIG. 5E.

As illustrated in FIG. 5E, the pixel circuit 144 may be further connected to a control line CLi and a sensing line SENj. For example, the pixel circuit 144 of the pixel PXL disposed in the i-th row and the j-th column of the display area DA may be connected to an i-th control line CLi and a j-th sensing line SENj of the display area DA. The pixel circuit 144 described above may further include a third transistor T3 as well as the first and second transistors T1 and T2 illustrated in FIGS. 5A and 5B.

The third transistor T3 is connected between the first transistor T1 and the sensing line SENj. For example, one electrode of the third transistor T3 may be connected to one terminal (for example, a source electrode) of the first transistor T1 connected to the first electrode EL1, and another electrode of the third transistor T3 may be connected to the sensing line SENj. In case that the sensing line SENj is omitted, the another electrode of the third transistor T3 may be connected to the data line Dj.

In an embodiment, the gate electrode of the third transistor T3 is connected to the control line CLi. In case that the control line CLi is omitted, the gate electrode of the third transistor T3 may be connected to the scan line Si. The third transistor T3 may be turned on by a control signal that has a gate-on voltage (for example, a high level) and is supplied to the control line CLi during a certain sensing period, so that the sensing line SENj and the first transistor T1 may be electrically connected to each other.

In an embodiment, the sensing period may be a period in which characteristic information of each of the pixels PXL disposed in the display area DA (for example, a threshold voltage and the like of the first transistor T1) is extracted or measured. During the above-mentioned sensing period, the first transistor T1 may be turned on by supplying a certain reference voltage for turning on the first transistor T1 to the first node N1 through the data line Dj and the second transistor T2, or for connecting each pixel PXL to a current source or the like. Furthermore, the third transistor T3 may be turned on by supplying a control signal having a gate-on voltage to the third transistor T3, so that the first transistor T1 may be connected to the sensing line SENj. Hence, the characteristic information of each pixel PXL that includes the threshold voltage and the like of the first transistor T1 may be extracted or sensed through the sensing line SENj. The extracted characteristic information may be used to convert image data to compensate for a deviation in characteristics between the pixels PXL.

Although FIG. 5E illustrates an embodiment where all of the first to third transistors T1 to T3 are N-type transistors, embodiments are not limited thereto. For example, at least one of the first to third transistors T1 to T3 may be implemented as a P-type transistor. Furthermore, although FIG. 5E illustrates an embodiment where the emission unit EMU is connected between the pixel circuit 144 and the second driving power supply VSS, the emission unit EMU may be connected between the first driving power supply VDD and the pixel circuit 144.

Although FIGS. 5A to 5E illustrate embodiments in which all light emitting elements LD of each emission unit EMU are connected in parallel to each other, embodiments are not limited thereto. In an embodiment, the emission unit EMU may include at least one serial set including a plurality of light emitting elements LD connected in parallel to each other. For example, the emission unit EMU may have a serial/parallel combination structure.

The structure of the pixel PXL are not limited to the embodiments illustrated in FIGS. 5A to 5E. For example, the corresponding pixel may have various structures. In an embodiment, each pixel PXL may be configured in a passive light emitting display device, or the like. In this case, the pixel circuit 144 may be omitted, and the opposite ends of the light emitting elements LD included in the emission unit EMU may be directly connected to the scan lines Si−1, Si, and Si+1, the data line Dj, the first power supply line PL1 to which the first driving power supply VDD is to be applied, the second power supply line PL2 to which the second driving power supply VSS is to be applied, and/or a control line.

Figure 6:
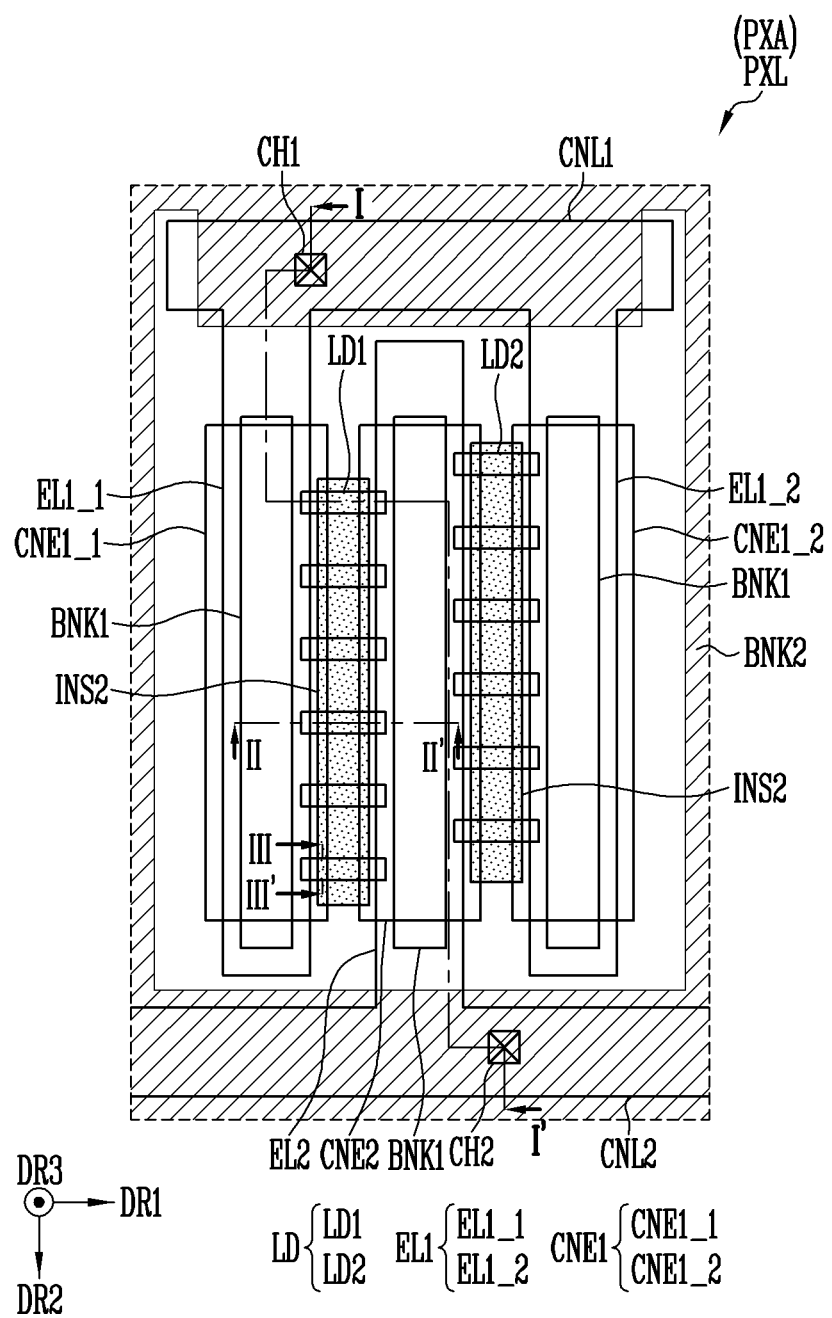
FIG. 6 is a schematic plan view illustrating one pixel of the pixels illustrated in FIG. 4.
Figure 7:
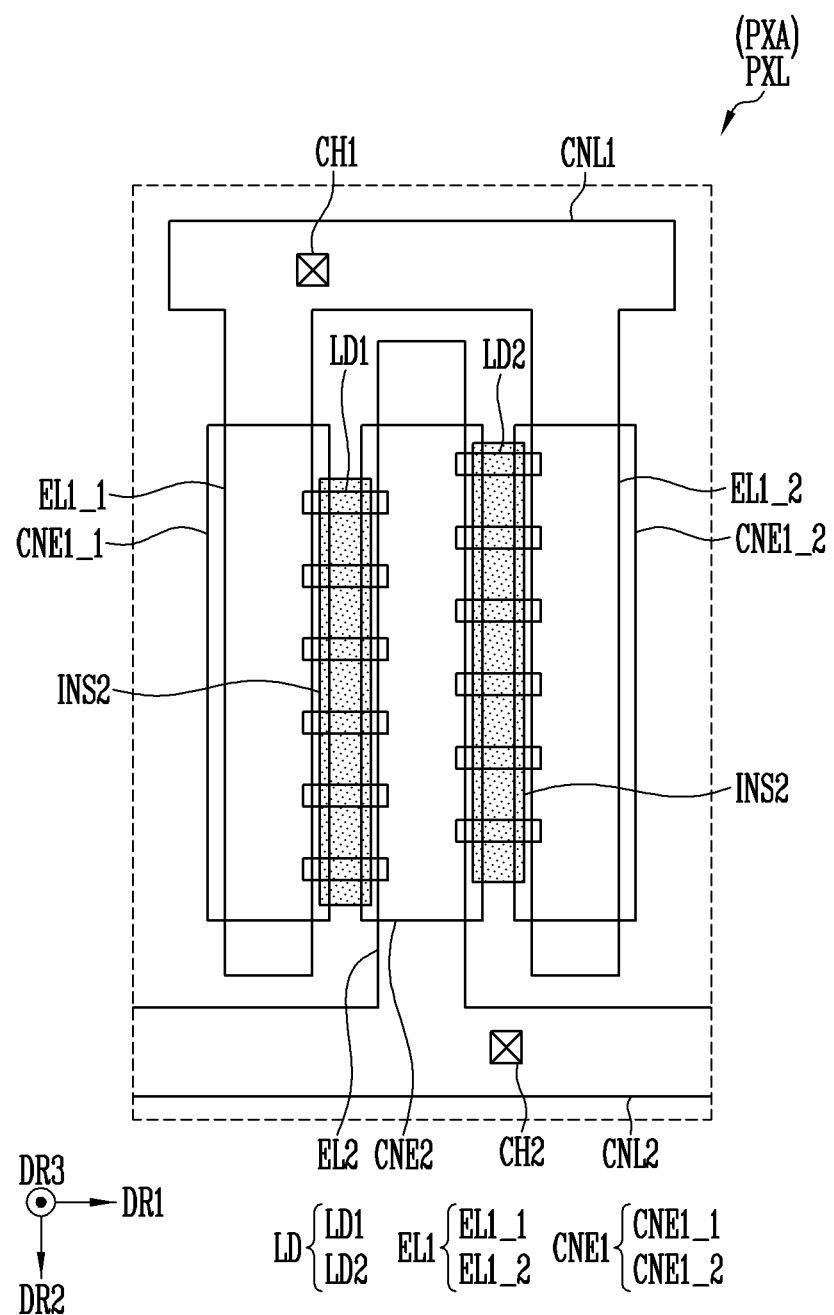
FIG. 7 is a schematic plan view illustrating the pixel of FIG. 6 including components other than first and second bank patterns.
Figure 8:
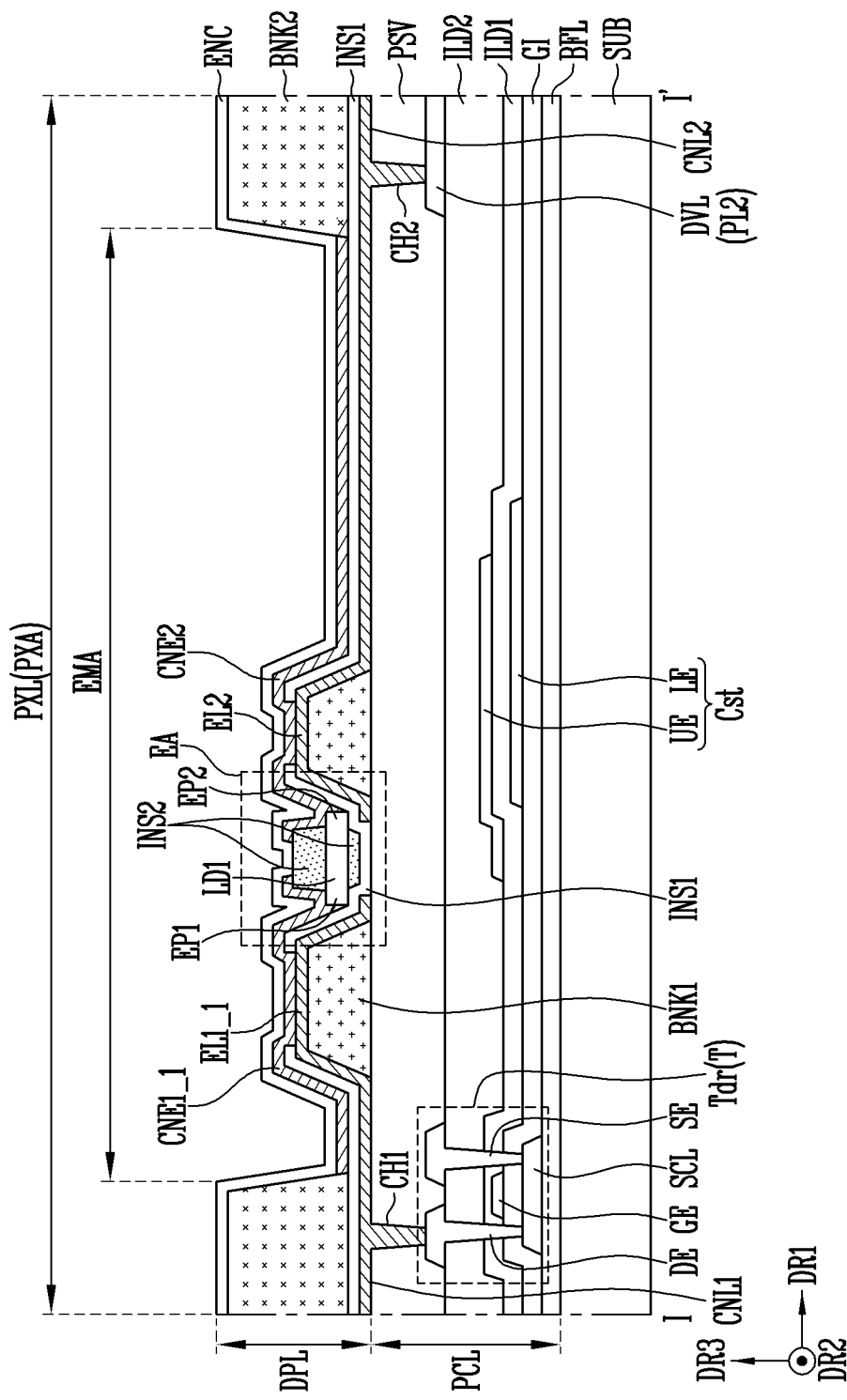
FIG. 8 is a schematic cross-sectional view taken along line I-I' of FIG. 6.
Figure 9:
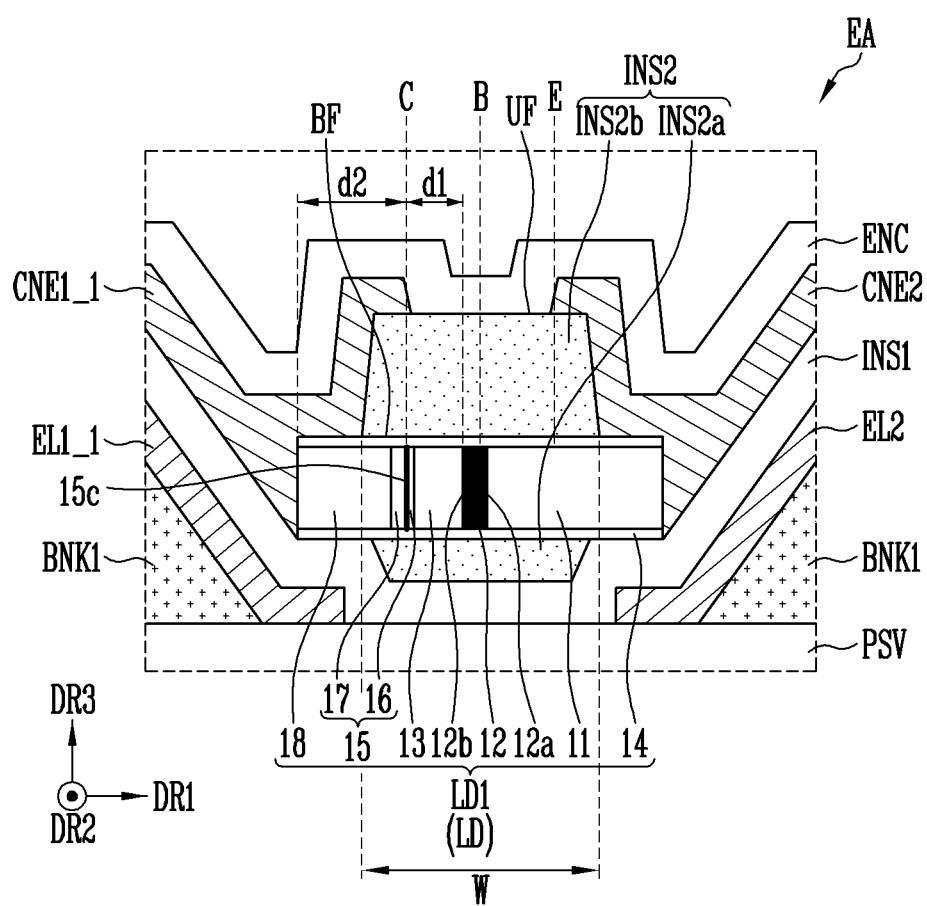
FIGS. 9 to 11 are schematic enlarged cross-sectional views of portion EA of FIG. 8.
Figure 10:
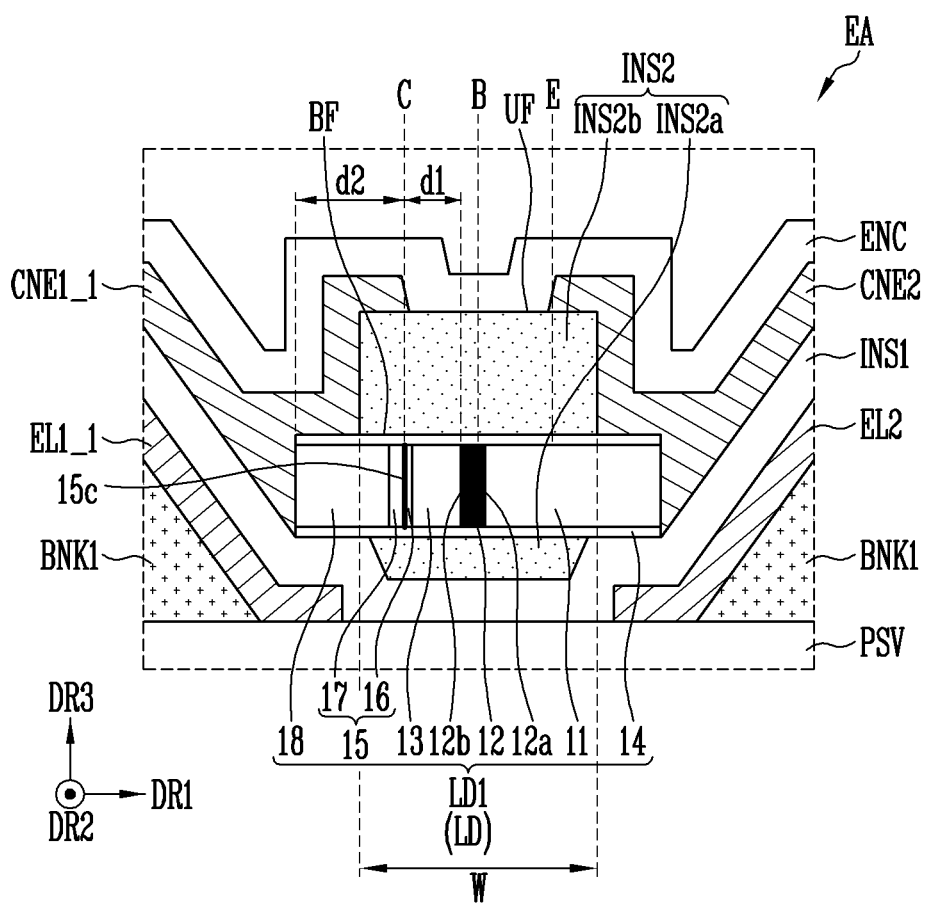
Figure 11:
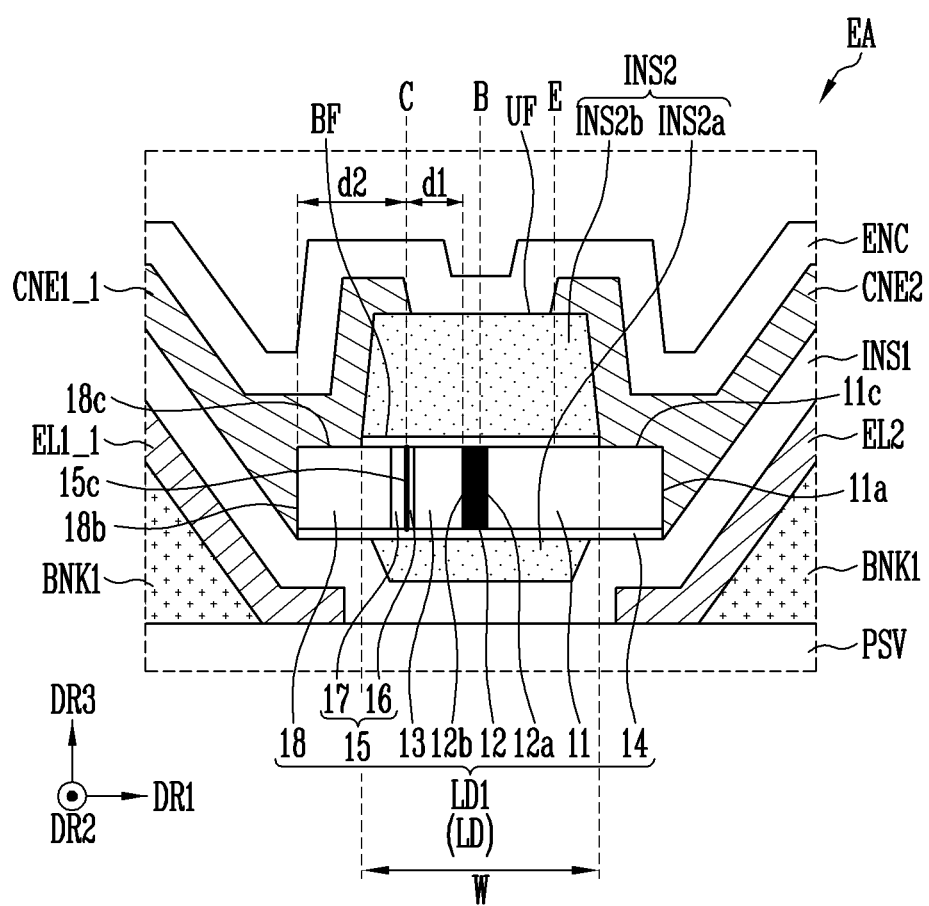
Figure 12:
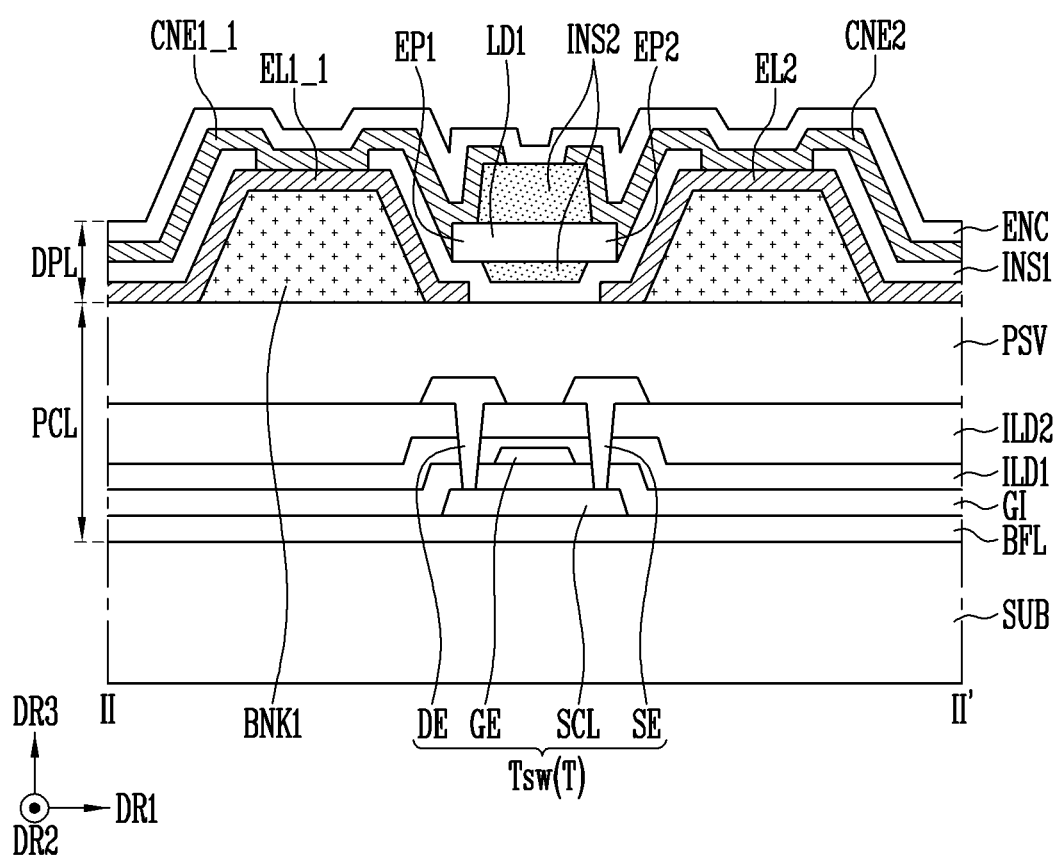
FIG. 12 is a schematic cross-sectional view taken along line II-IF of FIG. 6.
Figure 13:
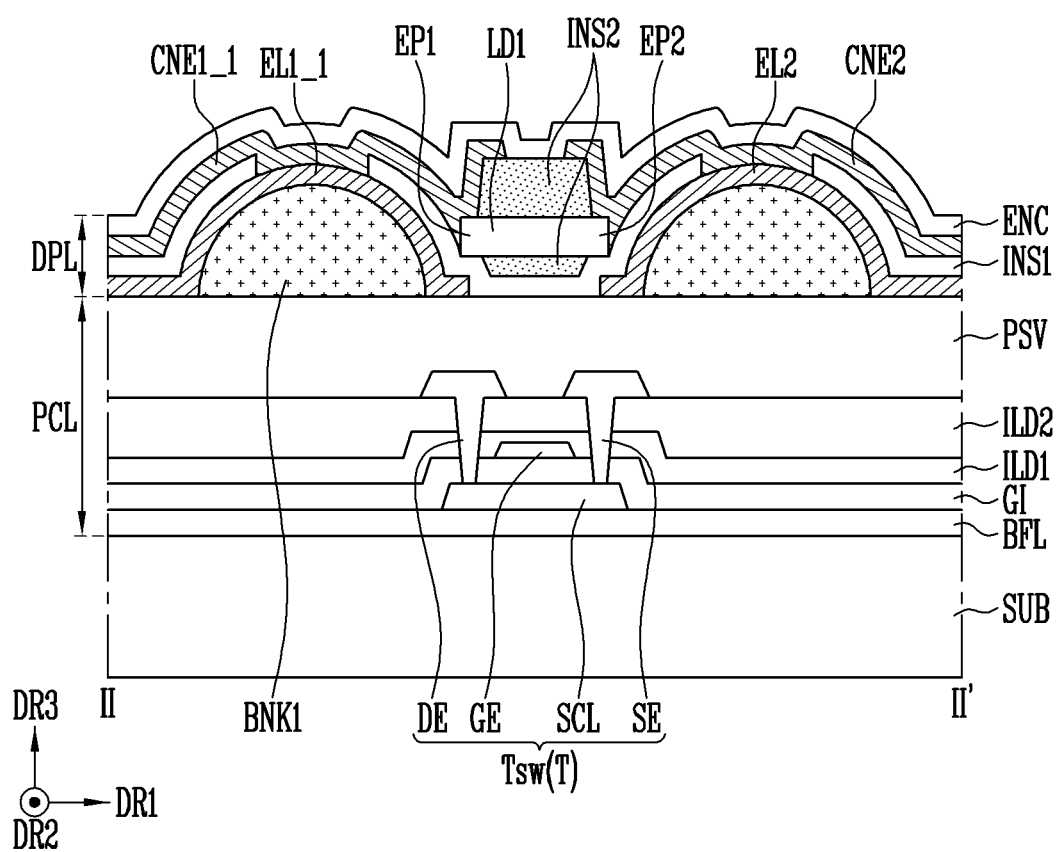
FIG. 13 illustrates another embodiment of a first bank pattern illustrated in FIG. 12, and is a schematic cross-sectional view corresponding to line II-IF of FIG. 6.
Figure 14:
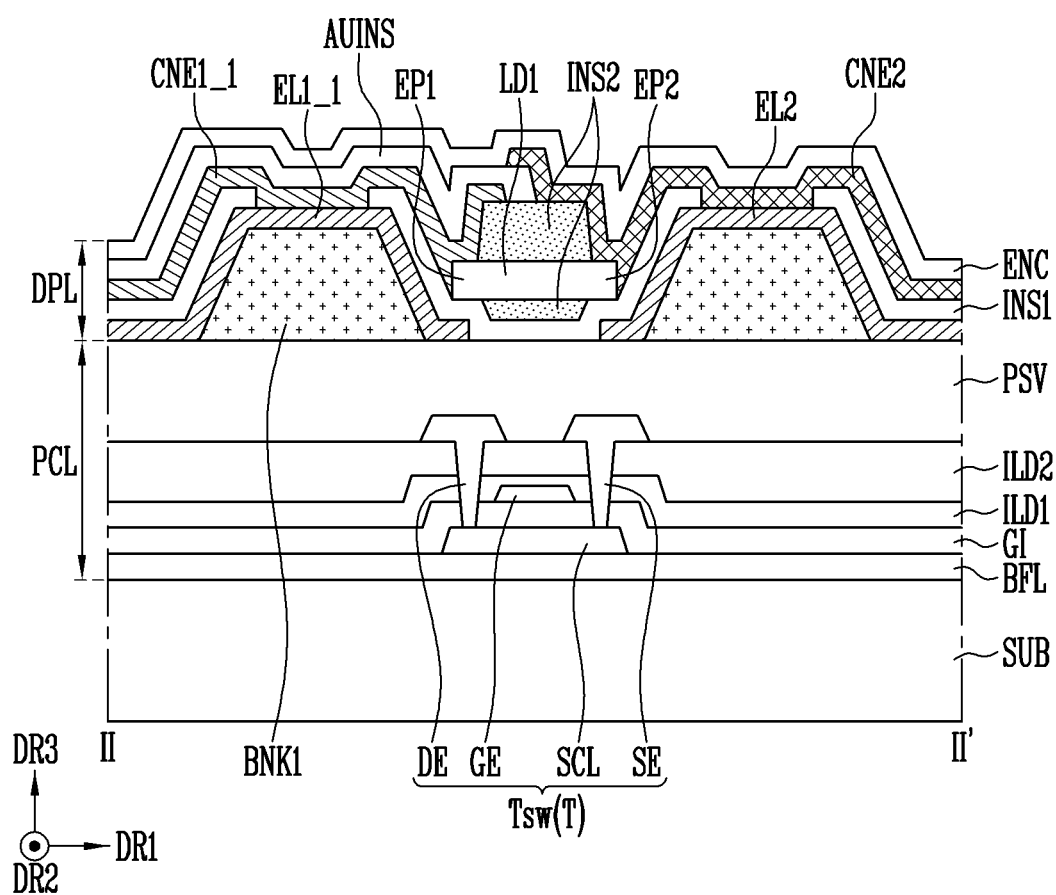
FIG. 14 illustrates another embodiment of a second contact electrode illustrated in FIG. 12, and is a cross-sectional view corresponding to line II-IF of FIG. 6.
Figure 15:
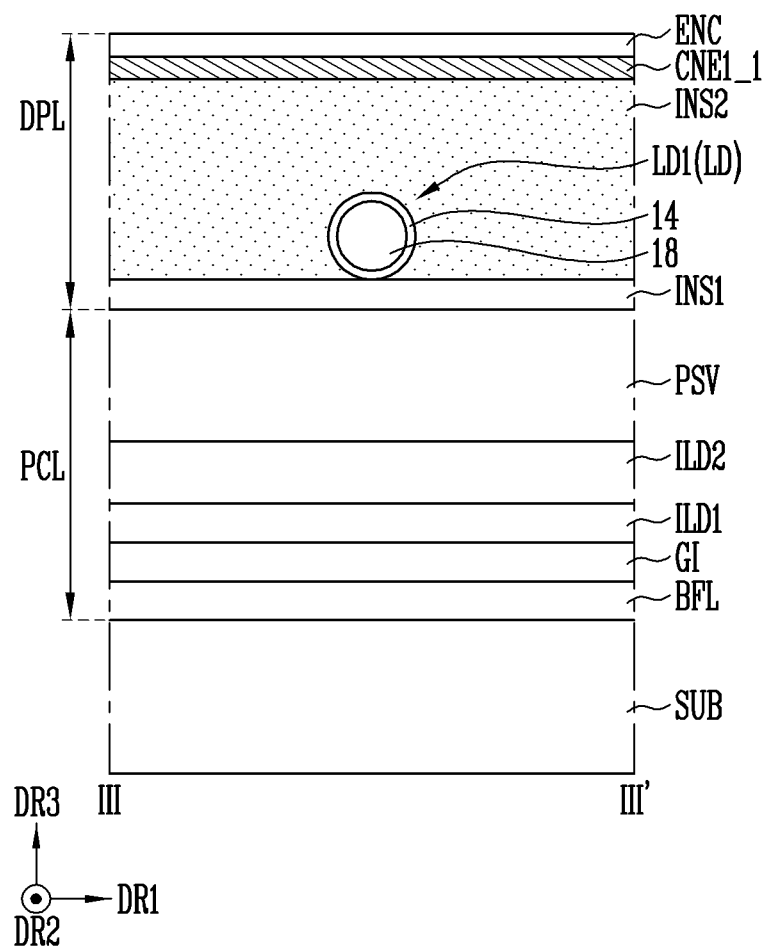
FIG. 15 is a schematic cross-sectional view taken along line of FIG. 6.

FIG. 6 is a schematic plan view illustrating one pixel of the pixels illustrated in FIG. 4. FIG. 7 is a schematic plan view illustrating the pixel of FIG. 6 including components other than first and second bank patterns. FIG. 8 is a schematic cross-sectional view taken along line I-I' of FIG. 6. FIGS. 9 to 11 are schematic enlarged cross-sectional views of portion EA of FIG. 8. FIG. 12 is a schematic cross-sectional view taken along line II-IF of FIG. 6. FIG. 13 illustrates another embodiment of the first bank pattern illustrated in FIG. 12, and is a schematic cross-sectional view corresponding to line II-IF of FIG. 6. FIG. 14 illustrates another embodiment of a second contact electrode illustrated in FIG. 12, and is a sectional view corresponding to line II-II' of FIG. 6. FIG. 15 is a schematic cross-sectional view taken along line of FIG. 6.

The pixel illustrated in FIG. 6 may be any one of the pixels that are respectively illustrated in FIGS. 5A to 5E. For example, the pixel illustrated FIG. 6 may be the pixel illustrated in FIG. 5A.

In FIGS. 6 and 7, for convenience of description, illustration of transistors connected to the light emitting elements, and some signal lines connected to the transistors is omitted.

Although FIGS. 6 to 15 simply illustrate the structure of a pixel PXL, for example, illustrate that each electrode is a single electrode layer and each insulating layer is a single insulating layer, embodiments are not limited thereto.

In an embodiment, "components are provided and/or formed on a same layer" may mean that the components are formed through a same process, and "components are provided and/or formed on different layers" may mean that the components are formed through different processes.

Furthermore, in an embodiment, the term "connection" between may mean that two components are electrically connected to each other and physically connected to each other.

In addition, for the sake of explanation, FIGS. 8 to 15 illustrate only one first light emitting element aligned between a 1-1-th electrode and the second electrode among the light emitting elements, but the one first light emitting element may substitute for each of the plurality of light emitting elements illustrated in FIGS. 6 and 7.

Referring to FIGS. 1 to 4, 5A, 6 to 15, a display device in accordance with an embodiment may include a substrate SUB, a signal line component, and a plurality of pixels PXL.

The substrate SUB may include transparent insulating material to transmit light. The substrate SUB may be a rigid substrate or a flexible substrate.

For example, the rigid substrate SUB may be one of a glass substrate, a quartz substrate, a glass ceramic substrate, and a crystalline glass substrate.

The flexible substrate SUB may be either a film substrate or a plastic substrate which includes polymer organic material. For example, the flexible substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

3 However, materials of the substrate SUB may be selected in various ways, and include, for example, fiber reinforced plastic (FRP). Material applied to the substrate SUB may have resistance (e.g., thermal resistance) to high treatment temperatures during a process of fabricating the display device.

The substrate SUB may include a display area DA including at least one pixel area PXA in which the pixel PXL is disposed, and a non-display area NDA disposed around the display area DA.

5 In an embodiment, pixels PXL may be arranged in the display area DA in a matrix shape and/or a stripe shape along a plurality of pixel rows extending in a first direction DR1 and a plurality of pixel columns extending a second direction DR2 different from the first direction DR1, for example, intersecting the first direction DR1, but embodiments are not limited thereto. In an embodiment, the pixels PXL may be disposed in the display area DA on the substrate SUB in various arrangement manners.

The pixel area PXA in which each pixel PXL is disposed (or provided) may include an emission area EMA from which light is emitted, and a peripheral area which encloses or surrounds a perimeter of the emission area EMA. In an embodiment, the term "peripheral area" may include a non-emission area from which no light is emitted.

The signal line component may include a plurality of signal lines configured to transmit signals (e.g., voltages) to each pixel PXL. For example, the signal lines may include an i-th scan line Si configured to transmit a scan signal to each pixel PXL, a data line Dj configured to transmit a data signal to each pixel PXL, and first and second power supply lines PL1 and PL2 configured to transmit driving power to each pixel PXL.

Each pixel PXL may include a pixel circuit layer PCL disposed on the substrate SUB and including a pixel circuit 144, and a display element layer DPL including a plurality of light emitting elements LD. The light emitting elements LD may be disposed in the emission area EMA provided in the pixel area PXA of each of the pixels PXL.

For the descriptive convenience, the pixel circuit layer PCL will be first described, and then the display element layer DPL will be described.

The pixel circuit layer PCL may include a buffer layer BFL, a pixel circuit 144 disposed on the buffer layer BFL, and a passivation layer PSV disposed on the pixel circuit 144.

The buffer layer BFL may prevent impurities from diffusing or transmitting into a transistor T included in the pixel circuit 144. The buffer layer BFL may be an inorganic insulating layer formed of inorganic material. The buffer layer BFL may include at least one of silicon nitride ($SiN_x$), silicon oxide ($SiO_x$), silicon oxynitride (SiON), and metal oxide such as aluminium oxide ($AlO_x$). Although the buffer layer BFL may be implemented in a single layer structure, the buffer layer BFL may be implemented in a multilayer structure having at least two or more layers. In case that the buffer layer BFL has a multilayer structure, the respective layers may be formed of a same material or different materials. The buffer layer BFL may be omitted according to the material of the substrate SUB or processing conditions.

The pixel circuit 144 may include at least one or more transistors T and a storage capacitor Cst. The transistors T may include a driving transistor Tdr configured to control driving current of the light emitting elements LD, and a switching transistor Tsw connected to the driving transistor Tdr. However, embodiments are not limited thereto. The pixel circuit 144 may further include circuit elements configured to perform other functions, as well as the driving transistor Tdr and the switching transistor Tsw. In the following embodiments, the driving transistor Tdr and the switching transistor Tsw may be included in the term "transistor T" or "transistors T". For example, the driving transistor Tdr may have a same configuration as that of the first transistor T1 described with reference to FIG. 5A. The switching transistor Tsw may have a same configuration as that of the second transistor T2 described with reference to FIG. 5A.

Each of the driving transistor Tdr and the switching transistor Tsw may include a semiconductor pattern SCL, a gate electrode GE, a first terminal SE, and a second terminal DE. The first terminal SE may be either a source electrode or a drain electrode, and the second terminal DE may be the other electrode. For example, in case that the first terminal SE is a source electrode, the second terminal DE may be a drain electrode.

The semiconductor pattern SCL may be provided and/or formed on the buffer layer BFL. The semiconductor pattern SCL may include a first contact area which contacts the first terminal SE, and a second contact area which contacts the second terminal DE. An area between the first contact area and the second contact area may be a channel area. The semiconductor pattern SCL may be a semiconductor pattern formed of polysilicon, amorphous silicon, an oxide semiconductor, or the like. The channel area may be a semiconductor pattern to which no impurity is doped, and may be an intrinsic semiconductor. Each of the first contact area and the second contact area may be a semiconductor pattern doped with impurities.

The gate electrode GE may be provided and/or formed on the transistor semiconductor pattern SCL with a gate insulating layer GI interposed therebetween.

The gate insulating layer GI may be an inorganic insulating layer including inorganic material. For example, the gate insulating layer GI may include at least one of silicon nitride ($SiN_x$), silicon oxide ($SiO_x$), silicon oxynitride (SiON), and metal oxide such as aluminium oxide ($AlO_x$). However, the material of the gate insulating layer GI is not limited to that of the foregoing embodiments. In an embodiment, the gate insulating layer GI may be implemented as an organic insulating layer including organic material. Although the gate insulating layer GI may be implemented in a single layer structure, the gate insulating layer GI may be implemented in a multilayer structure having at least two or more layers.

The first terminal SE and the second terminal DE may respectively contact the first contact area and the second contact area of the semiconductor pattern SCL through corresponding contact holes that pass through a first interlayer insulating layer ILD1 and the gate insulating layer GI. For example, the first terminal SE may contact one contact area of the first and second contact areas of the semiconductor pattern SCL. The second terminal DE may contact the other contact area of the first and second contact areas of the semiconductor pattern SCL.

The first interlayer insulating layer ILD1 may be an inorganic insulating layer including inorganic material. For example, the first interlayer insulating layer ILD1 may include at least one of silicon oxide ($SiO_x$), silicon nitride ($SiN_x$), silicon oxynitride (SiON), and metal oxide such as aluminium oxide ($AlO_x$). The first interlayer insulating layer ILD1 may include a single layer or multiple layers. In an embodiment, the first interlayer insulating layer ILD1 may be an organic insulating layer including organic material.

Although the first and second terminals SE and DE of each of the driving transistor Tdr and the switching transistor Tsw each have been described as being a separate electrode electrically connected to the transistor semiconductor pattern SCL through the contact hole that passes through the gate insulating layer GI and the first interlayer insulating layer ILD1, embodiments not limited thereto. In an embodiment, the first terminal SE of each of the driving transistor Tdr and the switching transistor Tsw may be one contact area of the first and second contact areas adjacent to the channel area of the corresponding semiconductor pattern SCL. The second terminal DE of each of the driving transistor Tdr and the switching transistor Tsw may be the other contact area of the first and second contact areas adjacent to the channel area of the corresponding semiconductor pattern SCL. In this case, the second terminal DE of the driving transistor Tdr may be electrically connected to the light emitting elements LD of the corresponding pixel PXL through a separate connector including a bridge electrode, a contact electrode, or the like.

In an embodiment, each of the transistors T included in the pixel circuit 144 may be formed of a low temperature poly silicon (LTPS) thin-film transistor, but embodiments are not limited thereto. In some embodiments, each transistor may be implemented as an oxide semiconductor thin-film transistor. Furthermore, there has been illustrated the case where each of the transistors T is a thin-film transistor having a top gate structure, but embodiments are not limited thereto. In an embodiment, each of the transistors T may be a thin-film transistor having a bottom gate structure.

In an embodiment, the transistors T included in the pixel circuit layer PCL may not only include the driving transistor Tdr and the switching transistor Tsw, but may also include additional transistors such as a transistor for compensating for a threshold voltage of the driving transistor Tdr, and a transistor for controlling an emission time of each of the light emitting elements LD.

Referring to FIG. 8, the storage capacitor Cst may include a lower electrode LE disposed on the gate insulating layer GI, and an upper electrode UE which is disposed on the first interlayer insulating layer ILD1 and overlaps the lower electrode LE.

The lower electrode LE may be disposed on a same layer as that of the gate electrode GE of the driving transistor Tdr and include a same material as that of the gate electrode GE. In an embodiment, the lower electrode LE and the gate electrode GE of the driving transistor Tdr may be integrally formed with each other. In this case, the lower electrode LE may be regarded as being one area of the gate electrode GE of the driving transistor Tdr. In another embodiment, the lower electrode LE may be provided as a component separate from the gate electrode GE of the driving transistor Tdr.

The upper electrode UE may overlap the lower electrode LE and cover the lower electrode LE. The capacitance of the storage capacitor Cst may be increased by increasing an overlapping area between the upper electrode UE and the lower electrode LE. The upper electrode UE may be electrically connected to the first power supply line PL1. Therefore, a voltage of the first driving power supply VDD applied to the first power supply line PL1 may be transmitted to the upper electrode UE.

A second interlayer insulating layer ILD2 may be provided and/or formed on the storage capacitor Cst. The second interlayer insulating layer ILD2 may cover the storage capacitor Cst. The second interlayer insulating layer ILD2 may be an inorganic insulating layer including inorganic material or an organic insulating layer including organic material. In an embodiment, the second interlayer insulating layer ILD2 may include a same material as that of the first interlayer insulating layer ILD1, but embodiments are not limited thereto. Although the second interlayer insulating layer ILD2 may be implemented as a single layer, it may be implemented as multiple layers including at least two or more layers.

The pixel circuit layer PCL may include a driving voltage line DVL provided and/or formed on the second interlayer insulating layer ILD2. The driving voltage line DVL may have a same configuration as that of the second power supply line PL2 described with reference to FIG. 5A. The second driving power supply VSS may be applied to the driving voltage line DVL. The pixel circuit layer PCL may further include the first power supply line PL1 to which the first driving power supply VDD is to be applied. The first power line supply PL1 may be disposed on a same layer as that of the driving voltage line DVL or disposed on a layer different from that of the driving voltage line DVL. Although the driving voltage line DVL in an embodiment has been described as being disposed on a same layer as that of the first and second terminals SE and DE of the driving transistor Tdr, embodiments are not limited thereto. In an embodiment, in case that the first and second terminals SE and DE of the transistor T are contact areas that are adjacent to the channel area of the transistor semiconductor pattern SCL, the driving voltage line DVL may be disposed on a same layer as that of any one conductive layer of the conductive layers provided in the pixel circuit layer layer PCL. For example, the location of the driving voltage line DVL in the pixel circuit layer PCL may be changed in various ways according to the type of transistor T.

The first power supply line PL1 may be electrically connected to a component of the display element layer DPL, for example, the first electrode EL1. The driving voltage line DVL may be electrically connected to a component of the display element layer DPL, for example, the second electrode EL2. The first power supply line PL1 and the driving voltage line DVL may respectively transmit alignment signals (e.g., alignment voltages) to the first and second electrodes EL1 and EL2 so as to align the light emitting elements LD in the pixel area PXA of each of the pixels PXL. After the light emitting elements LD have been aligned, the first power supply line PL1 and the driving voltage line DVL each may transmit corresponding driving power to each pixel PXL to drive the light emitting elements LD.

Each of the first power supply line PL1 and the driving voltage line DVL may include conductive material. For example, each of the first power supply line PL1 and the driving voltage line DVL may have a single layer structure, which is formed of one or combination selected from the group consisting of molybdenum (Mo), tungsten (W), aluminum neodymium (AlNd), titanium (Ti), aluminium (Al), silver (Ag), and an alloy thereof, or may have a double-layer or multilayer structure, which is formed of molybdenum (Mo), aluminium (Al), or silver (Ag) that is low resistance material so as to reduce line resistance.

The passivation layer PSV may be provided and/or formed on the transistors T and the driving voltage line DVL.

The passivation layer PSV may be implemented in the form of an organic insulating layer, an inorganic insulating layer, or a structure including an organic insulating layer disposed on an inorganic insulating layer. The inorganic insulating layer may include, for example, at least one of silicon oxide ($SiO_x$), silicon nitride ($SiN_x$), silicon oxynitride (SiON), and metal oxide such as aluminium oxide ($AlO_x$). The organic insulating layer may include, for example, at least one of polyacrylates resin, epoxy resin, phenolic resin, polyamides resin, polyimides rein, unsaturated polyesters resin, poly-phenylen ethers resin, poly-phenylene sulfides resin, and benzocyclobutene resin.

The passivation layer PSV may include a first contact hole CH1 which exposes one area of the driving transistor Tdr, and a second contact hole CH2 which exposes one area of the driving voltage line DVL.

The display element layer DPL may be disposed on the passivation layer PSV.

The display element layer DPL may include first and second bank patterns BNK1 and BNK2, first and second electrodes EL1 and EL2, first and second connection lines CNL1 and CNL2, light emitting elements LD, and first and second contact electrodes CNE1 and CNE2. For example, the display element layer DPL may further include a first insulating layer INS1, a second insulating layer INS2, and an encapsulation layer ENC.

The first bank pattern BNK1 may be disposed in the emission area EMA, from which light is to be emitted, in the pixel area PXA of each of the pixels PXL. The first bank pattern BNK1 may be a support component which supports each of the first and second electrodes EL1 and EL2 so as to change a surface profile (or shape) of each of the first and second electrodes EL1 and EL2 so that light emitted from the light emitting elements LD may be guided in an image display direction of the display device.

The first bank pattern BNK1 may be provided and/or formed between the passivation layer PSV in the emission area EMA of each pixel PXL and the first and second electrodes EL1 and EL2. For example, the first bank pattern BNK1 may be provided and/or formed each between the passivation layer PSV and the first electrode EL1 and between the passivation layer PSV and the second electrode EL2. The first bank pattern BNK1 may include an inorganic insulating layer formed of inorganic material, or an organic insulating layer formed of organic material. In an embodiment, the first bank pattern BNK1 may include an organic insulating layer having a single layer structure and/or an inorganic insulating layer having a single layer structure, but embodiments are not limited thereto. In an embodiment, the first bank pattern BNK1 may be implemented in the form of a multilayer structure formed by stacking at least one organic insulating layer and at least one inorganic insulating layer. However, the material of the first bank pattern BNK1 is not limited to the foregoing embodiments. In an embodiment, the first bank pattern BNK1 may include conductive material.

The first bank pattern BNK1 may have a trapezoidal cross-section which is reduced in width from one surface of the passivation layer PSV upward, but embodiments are not limited thereto. In an embodiment, the first bank pattern BNK1 may include a curved surface having a cross-section having a semi-elliptical shape, a semi-circular shape (or a hemispherical shape), etc., which is reduced in width upward from one surface of the passivation layer PSV, as illustrated in FIG. 13. In a cross-sectional view, the shape of the first bank pattern BNK1 is not limited to the foregoing embodiments, and may be changed in various ways within a range in which the efficiency of light emitted from each of the light emitting elements LD may be enhanced. First bank patterns BNK1 adjacent to each other in the first direction DR1 may be disposed on a same surface on the passivation layer PSV and have a same height (or thickness).

The first bank pattern BNK1 may have, in a plan view, a bar shape extending in the second direction DR2 (e.g., in the vertical direction), but embodiments are not limited thereto. The shape of the first bank pattern BNK1 may be changed in various ways.

The second bank pattern BNK2 may enclose at least one side of the peripheral area of the pixel area PXA of each pixel PXL. The peripheral area may include a non-emission area from which no light is emitted.

The second bank pattern BNK2 may be a structure configured to define (or partition) the emission area EMA of each of the pixels PXL and, for example, may be a pixel defining layer. The second bank pattern BNK2 may include at least one light block material and/or reflective material, thereby preventing a light leakage defect in which light (or rays) leaks between the pixels PXL. In an embodiment, a reflective layer may be formed on the second bank pattern BNK2 so as to further enhance the efficiency of light emitted from each of the pixels PXL. The second bank pattern BNK2 may be provided and/or formed on a layer different from that of the first bank pattern BNK1, but embodiments are not limited thereto. In an embodiment, the second bank pattern BNK2 may be provided and/or formed on a same layer as that of the first bank pattern BNK1. In an embodiment, the second bank pattern BNK2 may be formed on a layer different from that of the first bank pattern BNK1 and disposed on a first insulating layer INS1.

The first connection line CNL1 may extend, in a plan view, in the first direction DR1 (for example, horizontal direction) of each of the pixels PXL. The first connection line CNL1 may be provided and/or formed, to drive each pixel PXL independently or individually from adjacent pixels PXL, in only each pixel PXL, and electrically and/or physically separated from the first connection line CNL1 provided and/or formed in each of the adjacent pixels PXL. The first connection line CNL1 disposed in each pixel PXL may be electrically connected to a component, for example, the driving transistor Tdr, included in the pixel circuit layer PCL of the corresponding pixel PXL, through the first contact hole CH1 that passes through the passivation layer PSV.

The second connection line CNL2 may extend, in a plan view, in a direction parallel to a direction in which the first connection line CNL1 extends. For instance, the second connection line CNL2 may extend in the first direction DR1. The second connection line CNL2 may be provided in common to each pixel PXL and pixels PXL adjacent thereto. Hence, a plurality of pixels PXL disposed in a same pixel row in the first direction DR1 may be connected in common to the second connection line CNL2. The second connection line CNL2 disposed in each pixel PXL may be electrically connected to a component, for example, the driving voltage line DVL, included in the pixel circuit layer PCL of the corresponding pixel PXL through the second contact hole CH2 that passes through the passivation layer PSV. Hence, the voltage of the second driving power supply VSS that is applied to the driving voltage line DVL may be transmitted to the second connection line CNL2.

Each of the first and second electrodes EL1 and EL2 may be disposed in the emission area EMA of each of the pixels PXL and extend in the second direction DR2. The first electrode EL1 and the second electrode EL2 may be disposed on a same surface and spaced apart from each other.

The first electrode EL1 may include a 1-1-th electrode EL1_1 and a 1-2-th electrode EL1_2 which diverge from the first connection line CNL1 in the second direction DR2. The 1-1-th electrode EL1_1, the 1-2-th electrode EL1_2, and the first connection line CNL1 may be integrally formed with each other and electrically and/or physically connected to each other. In case that the first electrode EL1 and the first connection line CNL1 are integrally formed with each other, the first connection line CNL1 may be one area of the first electrode ELL or the first electrode EL1 may be one area of the first connection line CNL1. For example, embodiments are not limited thereto. In some embodiments, the first electrode EL1 and the first connection line CNL1 may be individually formed and electrically connected to each other through a contact hole, a connector, etc.

The second electrode EL2 may diverge from the second connection line CNL2 in the second direction DR2. The second electrode EL2 and the second connection line CNL2 may be integrally formed with each other and electrically and/or physically connected to each other. In case that the second electrode EL2 and the second connection line CNL2 are integrally formed with each other, the second connection line CNL2 may be one area of the second electrode EL2, or the second electrode EL2 may be one area of the second connection line CNL2. However, embodiments are not limited thereto. In some embodiments, the second electrode EL2 and the second connection line CNL2 may be individually formed and electrically connected to each other through a contact hole, a connector, etc.

The second electrode EL2 may be disposed between the 1-1-th electrode EL1_1 and the 1-2-th electrode EL1_2. The 1-1-th electrode EL1_1 and the second electrode EL2 may be spaced apart from each other by a certain distance. The second electrode EL2 and the 1-2-th electrode EL1_2 may be spaced apart from each other by a certain distance. In the emission area EMA of each of the pixels PXL, the distance between the 1-1-th electrode EL1_1 and the second electrode EL2 and the distance between the second electrode EL2 and the 1-2-th electrode EL1_2 may be a same as each other. Therefore, the light emitting elements LD may be more uniformly aligned in the emission area EMA of each of the pixels PXL. However, embodiments are not limited thereto. In an embodiment, the distance between the 1-1-th electrode EL1_1 and the second electrode EL2 and the distance between the second electrode EL2 and the 1-2-th electrode EL1_2 may differ from each other.

Each of the first and second electrodes EL1 and EL2 may be provided and/or formed on the first bank pattern BNK1 and have a surface profile corresponding to the shape of the first bank pattern BNK1. For example, each of the first and second electrodes EL1 and EL2 may include a protrusion corresponding to the first bank pattern BNK1, and a planar portion corresponding to one surface of the passivation layer PSV.

Each of the first and second electrodes EL1 and EL2 may be formed of material having a predetermined reflectivity such that light is emitted from each of the light emitting elements LD to travel in an image display direction of the display device. Each of the first and second electrodes EL1 and EL2 may be made of conductive material (or substance) having a certain reflectivity. The conductive material (or substance) may include opaque metal that is advantageous for reflecting, in the image display direction of the display device, light emitted from the light emitting elements LD. For example, the opaque metal may include metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. In an embodiment, each of the first and second electrodes EL1 and EL2 may include transparent conductive material (or substance). The transparent conductive material (or substance) may include conductive oxides such as indium tin oxide (ITO), indium zinc oxide (IZO), zinc oxide (ZnO), and indium tin zinc oxide (ITZO), and a conductive polymer such as PEDOT. In case that the first and second electrodes EL1 and EL2 include transparent conductive material, a separate conductive layer formed of opaque metal for reflecting light emitted from the light emitting elements LD in the image display direction of the display device may be added. However, the material of the first and second electrodes EL1 and EL2 is not limited to the foregoing materials.

Although each of the first and second electrodes EL1 and EL2 may be provided and/or formed in a single layer structure, embodiments are not limited thereto. In an embodiment, each of the first and second electrodes EL1 and EL2 may be provided and/or formed in a multilayer structure formed by stacking at least two materials among metals, alloys, conductive oxides, and conductive polymers. Each of the first and second electrodes EL1 and EL2 may have a multilayer structure including at least two layers to minimize distortion resulting from a signal delay when signals (e.g., voltages) are transmitted to opposite ends EP1 and EP2 of each of the light emitting elements LD. In this case, each of the first and second electrodes EL1 and EL2 may have a multilayer structure formed by stacking layers, for example, in a sequence of indium tin oxide (ITO)/silver(Ag)/indium tin oxide (ITO).

In case that the first connection line and the first electrode EL1 are integrally formed with each other, the first connection line CNL1 may include a same material of that of the first electrode EL1. In case that the second connection line CNL2 and the second electrode EL2 are integrally formed with each other, the second connection line CNL2 may include a same material of that of the second electrode EL2.

As described above, since each of the first and second electrodes EL1 and EL2 have a surface profile corresponding to the shape of the first bank pattern BNK1 disposed therebelow, light emitted from each of the light emitting elements LD may be reflected by each of the first and second electrodes EL1 and EL2 and more effectively travel in the image display direction of the display device. Consequently, the efficiency of light emitted from each of the light emitting elements LD may be further enhanced.

The first bank pattern BNK1 and the first and second electrodes EL1 and EL2 each may function as a reflective component configured to guide light emitted from the light emitting elements LD in a desired direction and thus enhance the optical efficiency of the display device.

Any one electrode of the first electrode EL1 and the second electrode EL2 may be an anode electrode, and the other electrode may be a cathode electrode. In an embodiment, the first electrode EL1 may be an anode electrode, and the second electrode EL2 may be a cathode electrode.

Although the first electrode EL1 has been described as including two electrodes, for example, the 1-1-th electrode EL1_1 and the 1-2-th electrode EL1_2, which diverge from the first connection line CNL1 in the second direction DR2, embodiments are not limited thereto. In an embodiment, the first electrode EL1 may include at least one or more electrodes that diverge from the first connection line CNL1 in the second direction DR2.

The first contact electrode CNE1 may be provided and/or formed on the first electrode EL1 to reliably electrically and/or physically connect the first electrode EL1 with one end of the opposite ends EP1 and EP2 of each of the light emitting elements LD.

The first contact electrode CNE1 may cover the first electrode EL1 and overlap the first electrode EL1. The first contact electrode CNE1 may be disposed directly on one area of the first electrode EL1 that is exposed from the first insulating layer INS1, and be connected to the first electrode EL1. In an embodiment, in case that a capping layer is disposed on the first electrode EL1 that is exposed from the first insulating layer INS1, the first contact electrode CNE1 may be disposed on the capping layer and electrically connected to the first electrode EL1 by the capping layer. For example, the capping layer may protect the first electrode EL1 from a defect or the like, which may occur during a process of fabricating the display device, and enhance adhesive force between the first electrode EL1 and the pixel circuit layer PCL disposed thereunder. The capping layer may be formed of transparent conductive material such as indium zinc oxide (IZO) to minimize loss of light emitted from each of the light emitting elements LD and reflected by the first electrode EL1 in the image display direction of the display device.

Furthermore, the first contact electrode CNE1 may be directly disposed on one end of the opposite ends EP1 and EP2 of each of the light emitting elements LD, and overlap the one end. The first contact electrode CNE1 may include a 1-1-th contact electrode CNE1_1 provided and/or formed on the 1-1-th electrode EL1_1, and a 1-2-th contact electrode CNE1_2 provided and/or formed on the 1-2-th electrode EL1_2.

The second contact electrode CNE2 may be provided and/or formed on the second electrode EL2 to reliably electrically and/or physically connect the second electrode EL2 with a remaining end of the opposite ends EP1 and EP2 of each of the light emitting elements LD. The second contact electrode CNE2 may cover the second electrode EL2 and overlap the second electrode EL2. Furthermore, the second contact electrode CNE2 may cover the remaining end of the opposite ends EP1 and EP2 of each of the light emitting elements LD, and overlap the remaining end.

The first and second contact electrodes CNE1 and CNE2 may be formed of various transparent conductive materials such that light is emitted from each of the light emitting elements LD and reflected by the first and second electrodes EL1 and EL2 to travel in the image display direction of the display device without loss. For example, the first and second contact electrodes CNE1 and CNE2 may include at least one of various transparent conductive materials including indium tin oxide (ITO), indium zinc oxide (IZO), zinc oxide (ZnO), and indium tin zinc oxide (ITZO), and be substantially transparent or translucent to satisfy a certain transmittancy. However, the material of the first and second contact electrodes CNE1 and CNE2 is not limited to the foregoing embodiments. In an embodiment, the first and second contact electrodes CNE1 and CNE2 may be formed of various opaque conductive materials.

The second contact electrode CNE2 may be disposed between the 1-1-th contact electrode CNE1_1 and the 1-2-th contact electrode CNE1_2. The 1-1-th contact electrode CNE1_1 and the second contact electrode CNE2 may be spaced apart from each other by a certain distance. The second contact electrode CNE2 and the 1-2-th contact electrode CNE1_2 may be spaced apart from each other by a certain distance. In the emission area EMA of each of the pixels PXL, the distance between the 1-1-th contact electrode CNE1_1 and the second contact electrode CNE2 and the distance between the second contact electrode CNE2 and the 1-2-th contact electrode CNE1_2 may be the same as each other. However, embodiments are not limited thereto. In an embodiment, the distance between the 1-1-th contact electrode CNE1_1 and the second contact electrode CNE2 and the distance between the second contact electrode CNE2 and the 1-2-th contact electrode CNE1_2 may differ from each other.

The first contact electrode CNE1 and the second contact electrode CNE2 may be disposed on a same layer and formed through a same process. However, embodiments are not limited thereto. In an embodiment, the first and second contact electrodes CNE1 and CNE2 may be disposed on different layers and formed through different processes. In case that the first contact electrode CNE1 and the second contact electrode CNE2 are disposed on different layers and formed through different processes, as illustrated in FIG. 14, an auxiliary insulating layer AUINS may be provided between the first contact electrode CNE1 and the second contact electrode CNE2. The auxiliary insulating layer AUINS may be disposed on the 1-1-th contact electrode CNE1_1 and cover the 1-1-th contact electrode CNE1_1. For example, the auxiliary insulating layer AUINS may be an inorganic insulating layer including inorganic material, or an organic insulating layer including organic material.

The encapsulation layer ENC may be provided and/or formed on the first and second contact electrodes CNE1 and CNE2. The encapsulation layer ENC may be an inorganic insulating layer including inorganic material or an organic insulating layer including organic material. For example, the encapsulation layer ENC may have a structure formed by alternately stacking at least one inorganic insulating layer and at least one organic insulating layer. The encapsulation layer ENC may cover the entirety of the display element layer DPL and prevent water or moisture from being drawn into the display element layer DPL including the light emitting elements LD from the outside.

Each of the light emitting elements LD may include a subminiature light emitting element which is made of material having an inorganic crystal structure and has a small size, for example, in a range of the nano scale to the micro scale. For example, each of the light emitting elements LD may be a subminiature light emitting element formed by an etching scheme, or a subminiature light emitting element formed by a growth scheme.

Although at least two to several tens of light emitting elements LD may be aligned and/or disposed in the pixel area PXA of each of the pixels PXL, the number of light emitting elements LD is not limited thereto. In an embodiment, the number of light emitting elements LD aligned and/or provided in the pixel area PXA may be changed in various ways.

The light emitting elements LD may be disposed between two electrodes adjacent to each other in the first direction DR1. The light emitting elements LD may include first light emitting elements LD1 disposed between the 1-1-th electrode EL1_1 and the second electrode EL2, and second light emitting elements LD2 disposed between the second electrode EL2 and the 1-2-th electrode EL1_2. In the following embodiment, the term "light emitting elements LD" will be used to arbitrarily designate one light emitting element of the first and second light emitting elements LD1 and LD2 or collectively designate the first and second light emitting elements LD1 and LD2.

Each of the light emitting elements LD may be aligned between two electrodes such that the longitudinal direction L is parallel to the first direction DR1. The light emitting elements LD may be diffused in a solution and supplied into the pixel area PXA of each pixel PXL.

In an embodiment, the light emitting elements LD may be supplied to the pixel area PXA of each pixel PXL by an inkjet printing scheme, a slit coating scheme, or other various schemes. For example, the light emitting elements LD may be mixed with a volatile solvent and then supplied to the pixel area PXA by an inkjet printing scheme or a slit coating scheme. For example, when the first and second electrodes EL1 and EL2 disposed in the pixel area PXA are respectively supplied with corresponding alignment signals, an electric field may be formed between two adjacent electrodes. Hence, the light emitting elements LD may be aligned between the 1-1-th electrode EL1_1 and the second electrode EL2 and between the second electrode EL2 and the 1-2-th electrode EL1_2.

After the alignment of the light emitting elements LD, the solvent may be removed by volatilization or other methods. As a result, the light emitting elements LD may be eventually aligned and/or disposed in the pixel area PXA of each pixel PXL.

The light emitting elements LD may be provided and/or formed on the first insulating layer INS1.

The first insulating layer INS1 may be provided and/or formed under each of the light emitting elements LD aligned between two electrodes in the pixel area PXA of each pixel PXL. The first insulating layer INS1 may be filled in space between each of the light emitting elements LD and the passivation layer PSV to stably support the light emitting elements LD and prevent the light emitting elements LD from being separated from the passivation layer PSV.

The first insulating layer INS1 may include an inorganic insulating layer including inorganic material, or an organic insulating layer including organic material. Although the first insulating layer INS1 may include an inorganic insulating layer that is advantageous for protecting the light emitting elements LD from the pixel circuit layer PCL of each pixel PXL, embodiments are not limited thereto. In an embodiment, the first insulating layer INS1 may include an organic insulating layer that is advantageous for planarization of support surfaces of the light emitting elements LD.

The first insulating layer INS1 may expose one area of each of the first and second electrodes EL1 and EL2 and cover the other areas except for the one area. For example, the first contact electrode CNE1 may be provided and/or formed on the exposed area of the first electrode EL1, and the second contact electrode CNE2 may be provided and/or formed on the exposed area of the second electrode EL2.

The second insulating layer INS2 may be provided and/or formed on the light emitting elements LD. The second insulating layer INS2 may be provided and/or formed on each of the light emitting elements LD to cover a portion of an upper surface of each of the light emitting elements LD, and expose the opposite ends EP1 and EP2 of each of the light emitting elements LD to the outside. The second insulating layer INS2 may be formed in an independent insulating pattern in the pixel area PXA of each pixel PXL, but embodiments are not limited thereto.

The second insulating layer INS2 may have a single layer structure or a multilayer structure, and include an inorganic insulating layer including at least one inorganic material or an organic insulating layer including at least one organic material. The second insulating layer INS2 may further reliably fix each of the light emitting elements LD aligned in the pixel area PXA of each of the pixels PXL. The second insulating layer INS2 may include an inorganic insulating layer that is advantageous for protecting the active layer 12 of each of the light emitting elements LD from external oxygen, water, etc. However, embodiments are not limited thereto. The second insulating layer INS2 may include an organic insulating layer including organic material, according to design conditions, and the like of the display device to which the light emitting elements LD are to be applied.

In an embodiment, after the alignment of the light emitting elements LD in the pixel area PXA of each of the pixels PXL has been completed, the second insulating layer INS2 is formed on the light emitting elements LD so that the light emitting elements LD may be prevented from being separated from the aligned position. In case that a gap (or space) is formed between the first insulating layer INS1 and the light emitting elements LD before the formation of the second insulating layer INS2, the gap may be filled with the second insulating layer INS2 during a process of forming the second insulating layer INS2. In this case, the second insulating layer INS2 include an organic insulating layer that is advantageous for filling the gap between the first insulating layer INS1 and the light emitting elements LD with the second insulating layer INS2.

The second insulating layer INS2 may include a 2a-th insulating layer INS2a that is filled in the gap between the first insulating layer INS1 and the light emitting elements LD, and a 2b-th insulating layer INS2b located on the second light emitting elements LD2. The 2b-th insulating layer INS2b may include a first surface BF (e.g., a lower surface) that contacts each of the light emitting elements LD, and a second surface UF (e.g., an upper surface) that is opposite to the first surface BF (e.g., the lower surface). In an embodiment, the first contact electrode CNE1 and the second contact electrode CNE2 may be spaced apart from each other by a certain distance on the second surface UF (e.g., the upper surface) of the 2b-th insulating layer INS2b.

The 2b-th insulating layer INS2b may have a trapezoidal cross-section in which the width thereof is reduced from the first surface BF (e.g., the lower surface) that contacts each of the light emitting elements LD toward the second surface UF (e.g., the upper surface), but embodiments are not limited thereto. In an embodiment, as illustrated in FIG. 10, the 2b-th insulating layer INS2b may have a rectangular cross-section in which the first surface BF (e.g., the lower surface) and the second surface UF (e.g., the upper surface) have the same width in the first direction DR1.

The second insulating layer INS2 may be formed on each of the light emitting elements LD so that the active layer 12 of each of the light emitting elements LD may be prevented from contacting external conductive material. The second insulating layer INS2 may cover only a portion of the surface of each of the light emitting elements LD such that the opposite ends EP1 and EP2 of each of the light emitting elements LD may be exposed to the outside.

Each of the light emitting elements LD may include a first semiconductor layer 11, an active layer 12, a second semiconductor layer 13, a third semiconductor layer 15, a fourth semiconductor layer 18, and an insulating film 14. For example, as illustrated in FIGS. 9 to 11, one first light emitting element LD1 aligned between the 1-1-th electrode EL1_1 and the second electrode EL2 may include a light emitting stacked pattern 10 in which the first semiconductor layer 11, the active layer 12, the second semiconductor layer 13, the third semiconductor layer 15, and the fourth semiconductor layer 18 are sequentially stacked in the listed order in the longitudinal direction (refer to 'L' of FIGS. 1 and 2) of the one first light emitting element LD1, and an insulating film 14 that encloses or surrounds a outer circumferential surface of the light emitting stacked pattern 10.

Each of the light emitting elements LD may be disposed on the first insulating layer INS1 between two adjacent electrodes. For example, each of the first light emitting elements LD1 may be disposed on the first insulating layer INS1 between the 1-1-th electrode EL1_1 and the second electrode EL2. Each of the second light emitting elements LD2 may be disposed on the first insulating layer INS1 between the second electrode EL2 and the 1-2-th electrode EL1_2.

The third semiconductor layer 15 included in the light emitting stacked pattern 10 of each of the light emitting elements LD may include a third-first semiconductor layer 16 disposed on the second semiconductor layer 13, and a third-second semiconductor layer 17 disposed between the third-first semiconductor layer 16 and the fourth semiconductor layer 18.

Based on a surface 15c (hereinafter referred to as 'contact surface') on which the third-first semiconductor layer 16 and the third-second semiconductor layer 17 contact each other, the second semiconductor layer 13 and the third-first semiconductor layer 16 that are disposed under the contact surface 15c each may include a p-type semiconductor layer doped with a p-type dopant, and the third-second semiconductor layer 17 and the fourth semiconductor layer 18 that are disposed over the contact surface 15c each may include an n-type semiconductor layer doped with an n-type dopant. In an embodiment, the third semiconductor layer 15 may be a tunneling junction layer including third-first and third-second semiconductor layers 16 and 17 that include different types of semiconductor layers.

In a sectional view, the contact surface 15c may be disposed between a half point B of a width W of one surface BF (e.g., a lower surface) of the 2b-th insulating layer INS2b in the first direction DR1 and a point corresponding to one end of the one surface BF (e.g., the lower surface) of the 2b-th insulating layer INS2b (e.g., one of opposite corners on which opposite sides of the 2b-th insulating layer INS2b and the one surface BF (e.g., the lower surface) contact each other) in the longitudinal direction L of each of the light emitting elements LD. For example, in a sectional view, the contact surface 15c may be disposed at a first point C corresponding to +40% in the longitudinal direction L of each of the light emitting elements LD from the half point B of the width W of the one surface BF (e.g., the lower surface) of the 2b-th insulating layer INS2b in the first direction DR1. Although the contact surface 15c of each light emitting element LD is disposed between the half point B of the width W of the one surface BF (e.g., the lower surface) of the 2b-th insulating layer INS2b in the first direction DR1 and the point corresponding to one end of the one surface BF (e.g., the lower surface) of the 2b-th insulating layer INS2b in the longitudinal direction L of the corresponding light emitting element LD, embodiments are not limited thereto. In an embodiment, the contact surface 15c of each of the light emitting elements LD may be disposed at any one point within a range in which the corresponding light emitting element LD overlaps the 2b-th insulating layer INS2b in the longitudinal direction L of the corresponding light emitting element LD.

Here, different types of semiconductor layers based on the contact surface 15 c may have different thicknesses. For example, in the longitudinal direction L of each of the light emitting elements LD, a thickness d1 as the thickness of the second semiconductor layer 13 and the third-first semiconductor layer 16 that are disposed under the contact surface 15 c may differ from a thickness d2 as the sum of the thickness of the third-second semiconductor layer 17 and the fourth semiconductor layer 18 that are disposed over the contact surface 15 c. For example, the thickness d2 as the sum of the thickness of the third-second semiconductor layer 17 and the fourth semiconductor layer 18 may be thicker (or greater) than the thickness d1 as the sum of the thickness of the second semiconductor layer 13 and the third-first semiconductor layer 16.

As described above, in case that the contact surface 15c is disposed at the first point C in the longitudinal direction L of each of the light emitting elements LD, and the thickness d2 of the n-type semiconductor layers disposed over the contact surface 15c is greater than the thickness d1 of the p-type semiconductor layers disposed under the contact surface 15c, the active layer 12 of each of the light emitting elements LD may be disposed in an intermediate (e.g., central) portion of the corresponding light emitting element LD or disposed adjacent to the intermediate (e.g., central) portion of the corresponding light emitting element LD.

The active layer 12 of each of the light emitting elements LD may include a first surface 12a and a second surface 12b. The first surface 12a may contact the first semiconductor layer 11 of the corresponding light emitting element LD. The second surface 12b may contact the second semiconductor layer 13 of the corresponding light emitting element LD. In an embodiment, in a sectional view, the first surface 12a of the active layer 12 of each of the light emitting elements LD may be disposed between the half point B of the width W of the one surface BF (e.g., the lower surface) of the 2b-th insulating layer INS2b in the first direction DR1 and a point corresponding to a remaining end of the one surface BF (e.g., the lower surface) of the 2b-th insulating layer INS2b (the other one of opposite corners on which the opposite sides of the 2b-th insulating layer INS2b and the one surface BF (e.g., the lower surface) contact each other) in the longitudinal direction L of the corresponding light emitting element LD. For example, in a sectional view, the first surface 12a of the active layer 12 of each of the light emitting elements LD may be disposed between the half point B of the width W of the one surface BF (e.g., the lower surface) of the 2b-th insulating layer INS2b in the first direction DR1 and a second point E corresponding to −40% in the longitudinal direction L of the corresponding light emitting element LD from the half point B. In this case, the active layer 12 of each of the light emitting elements LD may be disposed in the intermediate (e.g., central) portion of the corresponding light emitting element LD in the longitudinal direction L of the corresponding light emitting element LD, or disposed adjacent to the intermediate (e.g., central) portion of the corresponding light emitting element LD. Although the first surface 12a of the active layer 12 of each of the light emitting elements LD is disposed between the half point B of the width W of the one surface BF (e.g., the lower surface) of the 2b-th insulating layer INS2b in the first direction DR1 and the point corresponding to the remaining end of the one surface BF (e.g., the lower surface) of the 2b-th insulating layer INS2b in the longitudinal direction L of the corresponding light emitting element LD, embodiments are not limited thereto. In an embodiment, the first surface 12a of the active layer 12 of each of the light emitting elements LD may be disposed at any one point within a range in which the corresponding light emitting element LD overlaps the 2b-th insulating layer INS2b in the longitudinal direction L of the corresponding light emitting element LD.

When the second insulating layer INS2 is formed, as illustrated in FIG. 11, a portion of the insulating film 14 of each of the light emitting elements LD may be detached or removed so that not only the lower surface 11a (e.g., the outer surface) of the first semiconductor layer 11 and the upper surface 18b (e.g., the outer surface) of the fourth semiconductor layer 18 but a portion of the outer circumferential surface of the light emitting stacked pattern 10 may also be exposed to the outside. For example, when the second insulating layer INS2 is formed, a portion of the insulating film 14 of each of the light emitting elements LD may be detached or removed so that one area 11c of the first semiconductor layer 11 of the corresponding light emitting element LD and one area 18c of the fourth semiconductor layer 18 of the corresponding light emitting element LD may be exposed to the outside. For example, the one area 11c of the first semiconductor layer 11 may be a portion of a side surface (e.g., an outer circumferential surface) of the first semiconductor layer 11. The one area 18c of the fourth semiconductor layer 18 may be a portion of a side surface (e.g., an outer circumferential surface) of the fourth semiconductor layer 18. In this case, in each light emitting element LD, an exposed surface area of each of the first and fourth semiconductor layers 11 and 18 may be increased. When the exposed surface area of the first semiconductor layer 11 is increased, a valid contact surface area between the first semiconductor layer 11 and the second contact electrode CNE2 may be further increased. Furthermore, when the exposed surface area of the fourth semiconductor layer 18 is increased, a valid contact surface area between the fourth semiconductor layer 18 and the first contact electrode CNE1 may be further increased.

The increase in the valid contact surface area of each of the light emitting elements LD may minimize contact defects of the corresponding light emitting element LD and reduce contact resistance of each of the first and fourth semiconductor layers 11 and 18. Hence, the characteristics of each of the light emitting elements LD are enhanced, so that the output efficiency of light emitted from each of the light emitting elements LD may be further enhanced.

As described above, in case that the active layer 12 is disposed in the intermediate (e.g., central) portion of each of the light emitting elements LD in the longitudinal direction L of the corresponding light emitting element LD or disposed adjacent to the intermediate (e.g., central) portion of the corresponding light emitting element LD, light emitted from the active layer 12 may uniformly (or evenly) travel toward the opposite ends EP1 and EP2 of the corresponding light emitting element LD rather than being biased or shifted to one side. Hence, the intensities of light emitted from the opposite ends EP1 and EP2 of each of the light emitting elements LD may be uniform, so that the optical efficiency of each of the light emitting elements LD may be enhanced.

When the active layer 12 of each of the light emitting elements LD is disposed to be biased or shifted to one end of the opposite ends EP1 and EP2 rather than being disposed in the intermediate (e.g., central) portion of the corresponding light emitting element LD, a portion of the insulating film 14 may be detached or removed when the second insulating layer INS2 is formed, so that the active layer 12 of the corresponding light emitting element LD can be exposed. In this case, the first and second contact electrodes CNE1 and CNE2 that are formed through a subsequent process and the exposed active layer 12 may contact each other, thereby causing an electrical short circuit. As a result, each of the light emitting elements LD may not be driven in forward bias.

Given this, in an embodiment, the active layer 12 of each of the light emitting elements LD may be disposed in the intermediate (e.g., central) portion of the corresponding light emitting element LD in the longitudinal direction L of the corresponding light emitting element LD, or disposed adjacent to the intermediate (or central) portion of the corresponding light emitting element LD, so that defects which may occur due to detachment of absence of the insulating film 14 during a fabrication process may be prevented from being caused.

Furthermore, in an embodiment, in the longitudinal direction L of each of the light emitting elements LD, the first semiconductor layer 11 may be disposed on one end of the opposite ends EP1 and EP2 of the corresponding light emitting element LD, and the fourth semiconductor layer 18 may be disposed on a remaining end of the opposite ends EP1 and EP2 of the light emitting element LD. For example, n-type semiconductor layers may be respectively disposed on the opposite ends EP1 and EP2 of each of the light emitting elements LD in the longitudinal direction L of the corresponding light emitting element LD, so that electrical characteristics of the corresponding light emitting element LD may be enhanced.

While various embodiments have been described above, those skilled in the art will appreciate that various modifications, additions and substitutions are possible, without departing from the scope of the present disclosure.

Therefore, the embodiments disclosed in this specification are only for illustrative purposes rather than limiting the technical scope of the present disclosure. The scope of the present disclosure must be defined by the accompanying claims.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

The invention claimed is:

1. A light emitting element comprising:
a first semiconductor layer;
an active layer disposed on the first semiconductor layer;
a second semiconductor layer disposed on the active layer;
a third semiconductor layer comprising a third-first semiconductor layer and a third-second semiconductor layer stacked on the second semiconductor layer; and
a fourth semiconductor layer disposed on the third-second semiconductor layer,
wherein
the third semiconductor layer is a tunneling junction layer,
a sum of a thickness of the fourth semiconductor layer and the third-second semiconductor layer is different from a sum of a thickness of the second semiconductor layer and the third-first semiconductor layer,
a first surface of the active layer, which is attached to the second semiconductor layer, is disposed above a half point of the light emitting element, and
a second surface of the active layer, which is attached to the first semiconductor layer is disposed below the half point of the light emitting element.

2. The light emitting element according to claim 1, wherein
the first semiconductor layer, the fourth semiconductor layer, and the third-second semiconductor layer comprise an n-type semiconductor layer doped with an n-type dopant, and
the second semiconductor layer and the third-first semiconductor layer comprise a p-type semiconductor layer doped with a p-type dopant.

3. The light emitting element according to claim 2, wherein the sum of the thickness of the fourth semiconductor layer and the third-second semiconductor layer is greater than the sum of the thickness of the second semiconductor layer and the third-first semiconductor layer.

4. The light emitting element according to claim 3, wherein
the third-first semiconductor layer is doped with the p-type dopant having a concentration higher than that of the second semiconductor layer, and
the third-second semiconductor layer is doped with the n-type dopant having a concentration higher than those of the first and the fourth semiconductor layers.

5. The light emitting element according to claim 3, further comprising:
an insulating layer surrounding an outer circumferential surface of each of the first semiconductor layer, the active layer, the second semiconductor layer, the third semiconductor layer, and the fourth semiconductor layer.

6. The light emitting element according to claim 3, wherein a distance from a contact surface between the third-first semiconductor layer and the third-second semiconductor layer to an outer surface of the fourth semiconductor layer is different from a distance from the contact surface between the third-first semiconductor layer and the third-second semiconductor layer to an outer surface of the first semiconductor layer.

7. The light emitting element according to claim 6, wherein the distance from the contact surface between the third-first semiconductor layer and the third-second semiconductor layer to the outer surface of the fourth semiconductor layer is less than the distance from the contact surface between the third-first semiconductor layer and the third-second semiconductor layer to the outer surface of the first semiconductor layer.

8. The light emitting element according to claim 6, wherein the contact surface between the third-first semiconductor layer and the third-second semiconductor layer is disposed closer to the outer surface of the fourth semiconductor layer than the outer surface of the first semiconductor layer, based on a point corresponding to a half of an entire length of the light emitting element.

9. A display device comprising:
a substrate comprising a display area including a plurality of pixel areas, and a non-display area surrounding at least one side of the display area; and
a pixel disposed in each of the pixel areas, wherein
the pixel comprises first and second electrodes spaced apart from each other on the substrate, a plurality of light emitting elements electrically connected to each of the first and second electrodes, and an insulating pattern disposed on one surface of each of the light emitting elements
each of the light emitting elements comprises
a first semiconductor layer, an active layer, a second semiconductor layer, a third semiconductor layer, and a fourth semiconductor layer that are sequentially stacked in a direction,
the third semiconductor layer is a tunneling junction layer,
the third semiconductor layer comprises a third-first semiconductor layer directly disposed on the second semiconductor layer, and a third-second semiconductor layer disposed between the third-first semiconductor layer and the fourth semiconductor layer, and
a sum of a thickness of the fourth semiconductor layer and the third-second semiconductor layer is different from a sum of a thickness of the second semiconductor layer and the third-first semiconductor layer,
wherein in a plan view the insulating pattern overlaps each of the light emitting elements between the first electrode and the second electrode, and
wherein a contact surface between the third-first semiconductor layer and the third-second semiconductor layer is disposed between a point corresponding to a half of an entire width of one surface of the insulating pattern that contacts each of the light emitting elements in a longitudinal direction of each of the light emitting elements and a point corresponding to one end of the one surface of the insulating pattern.

10. The display device according to claim 9, wherein
the first semiconductor layer, the fourth semiconductor layer, and the third-second semiconductor layer comprise an n-type semiconductor layer doped with an n-type dopant, and
the second semiconductor layer and the third-first semiconductor layer comprise a p-type semiconductor layer doped with a p-type dopant.

11. The display device according to claim 10, wherein the sum of the thickness of the third-second semiconductor layer and the fourth semiconductor layer that are sequentially stacked in the direction is greater than the sum of the thickness of the second semiconductor layer and the third-first semiconductor layer that are sequentially stacked in the direction.

12. The display device according to claim 11, wherein
the third-first semiconductor layer is doped with the p-type dopant having a concentration higher than that of the second semiconductor layer, and
the third-second semiconductor layer is doped with the n-type dopant having a concentration higher than those of the first and the fourth semiconductor layers.

13. The display device according to claim 9, wherein a distance from the contact surface between the third-first semiconductor layer and the third-second semiconductor layer to an outer surface of the fourth semiconductor layer in the direction is less than a distance from the contact surface between the third-first semiconductor layer and the third-second semiconductor layer to an outer surface of the first semiconductor layer.

14. The display device according to claim 13, wherein the contact surface between the third-first semiconductor layer and the third-second semiconductor layer is disposed closer to the outer surface of the fourth semiconductor layer than to the outer surface of the first semiconductor layer, based on a point corresponding to a half of an entire length of each of the light emitting elements in the direction.

15. The display device according to claim 9, wherein
the active layer of each of the light emitting elements includes a first surface that contacts the first semiconductor layer in the direction; and
a second surface opposite to the first surface and contacting the second semiconductor layer, and
the first surface of the active layer is disposed between the point corresponding to the half of the entire width of the one surface of the insulating pattern that contacts each of the light emitting elements in the longitudinal direction of each of the light emitting elements and a point corresponding to another end of the one surface of the insulating pattern.

16. The display device according to claim 13, wherein the pixel further comprises:
a bank pattern disposed between the substrate and the first electrode and between the substrate and the second electrode;
a first contact electrode that connects each of the light emitting elements with the first electrode; and
a second contact electrode that connects each of the light emitting elements with the second electrode.

17. The display device according to claim 16, wherein each of the light emitting elements comprises:
an insulating layer surrounding each of an outer circumferential surface of the first semiconductor layer, an outer circumferential surface of the active layer, an outer circumferential surface of the second semiconductor layer, an outer circumferential surface of the third semiconductor layer, and an outer circumferential surface of the fourth semiconductor layer that are sequentially stacked in the direction,
the first semiconductor layer comprises a portion of a side surface and the outer surface that are not covered with the insulating layer in the direction, and
the fourth semiconductor layer comprises a portion of a side surface and the outer surface that are not covered with the insulating layer in the direction.

18. The display device according to claim 17, wherein
the first contact electrode directly contacts the portion of the side surface and the outer surface of the first semiconductor layer, and the second contact electrode directly contacts the portion of the side surface and the outer surface of the fourth semiconductor layer.

19. A display device comprising:
a substrate on which a plurality of pixels are disposed, wherein
each of the pixels comprises:
a plurality of light emitting elements disposed on the substrate;
a first electrode electrically connected to an end of each of the light emitting elements, and a second electrode electrically connected to a remaining end of each of the light emitting elements, the first electrode and the second electrode being spaced apart from each other; and
an insulating pattern disposed on one surface of each of the light emitting elements, wherein in a plan view, the insulating pattern overlaps each of the light emitting elements between the first electrode and the second electrode,
each of the light emitting elements comprises:
a first semiconductor layer, an active layer, a second semiconductor layer, a third semiconductor layer, and a fourth semiconductor layer that are stacked in a direction, the third semiconductor layer is a tunneling junction layer and comprises:
a third-first semiconductor layer directly disposed on the second semiconductor layer; and
a third-second semiconductor layer disposed between the third-first semiconductor layer and the fourth semiconductor layer,
semiconductor layers of a same type are disposed on opposite ends of each of the light emitting elements, and
a distance from a contact surface between the third-first semiconductor layer and the third-second semiconductor layer to an outer surface of the fourth semiconductor layer in the direction is less than a distance from the contact surface between the third-first semiconductor layer and the third-second semiconductor layer to an outer surface of the first semiconductor layer, and
the contact surface is disposed between a point corresponding to a half of an entire width of one surface of the insulating pattern that contacts each of the light emitting elements in a longitudinal direction of each of the light emitting elements and a point corresponding to one end of the one surface of the insulating pattern.

20. The display device of claim 19, wherein
the first semiconductor layer is disposed on an end of the opposite ends of each of the light emitting elements, and the fourth semiconductor layer is disposed on a remaining end of the opposite ends of each of the light emitting elements,
the first and fourth semiconductor layers comprise an n-type semiconductor layer doped with an n-type dopant.

* * * * *